US012622048B2

(12) United States Patent
Park et al.

(10) Patent No.: US 12,622,048 B2
(45) Date of Patent: May 5, 2026

(54) SEMICONDUCTOR DEVICE WITH MULTIPLE SHEET PATTERNS

(71) Applicant: Samsung Electronics Co., Ltd., Suwon-si (KR)

(72) Inventors: Jun Mo Park, Seoul (KR); Yeon Ho Park, Seoul (KR); Eun Sil Park, Hwaseong-si (KR); Jin Seok Lee, Busan (KR); Wang Seop Lim, Cheonan-si (KR); Kyu Bong Choi, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 926 days.

(21) Appl. No.: 17/852,658

(22) Filed: Jun. 29, 2022

(65) Prior Publication Data

US 2023/0086174 A1 Mar. 23, 2023

(30) Foreign Application Priority Data

Sep. 23, 2021 (KR) ........................ 10-2021-0125581

(51) Int. Cl.
*H10D 84/83* (2025.01)
*H01L 21/02* (2006.01)
(Continued)

(52) U.S. Cl.
CPC ....... *H10D 84/83* (2025.01); *H01L 21/02603* (2013.01); *H01L 21/28088* (2013.01);
(Continued)

(58) Field of Classification Search
CPC ........................... H01L 25/0753; H01L 25/167
See application file for complete search history.

(56) References Cited

U.S. PATENT DOCUMENTS 9,929,245 B2 3/2018 Colinge et al.
10,332,803 B1 * 6/2019 Xie ...................... H10D 84/853
(Continued)

FOREIGN PATENT DOCUMENTS

KR 1020200084532 A 7/2020
KR 1020200113492 A 10/2020
(Continued)

OTHER PUBLICATIONS

Notice of Allowance in Korean Appln. No. 10-2021-0125581, mailed on Jan. 31, 2026, 5 pages (with English translation).

*Primary Examiner* — William B Partridge
*Assistant Examiner* — Mehek Ahmed
(74) *Attorney, Agent, or Firm* — Fish & Richardson P.C.

(57) ABSTRACT

A semiconductor device includes first and second sheet patterns spaced apart from each other on a first region of the substrate, a first gate electrode extending between the first and second sheet patterns, third and fourth sheet patterns spaced apart from each other on a second region of the substrate, and a second gate electrode extending between the third and fourth sheet patterns. The first gate electrode includes a first work function controlling film, which is between the first and second sheet patterns, and a first filling conductive film on the first work function controlling film. The second gate electrode includes a second work function controlling film, which is between the third and fourth sheet patterns, and a second filling conductive film on the second work function controlling film. A distance between the third and fourth sheet patterns is greater than a distance between the first and second sheet patterns.

20 Claims, 26 Drawing Sheets

(51) Int. Cl.

| | |
|---|---|
| *H01L 21/28* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |

(52) U.S. Cl.
   CPC ......... *H10D 30/014* (2025.01); *H10D 30/031* (2025.01); *H10D 30/43* (2025.01); *H10D 30/6735* (2025.01); *H10D 30/6739* (2025.01); *H10D 30/6757* (2025.01); *H10D 62/121* (2025.01); *H10D 62/151* (2025.01); *H10D 64/017* (2025.01); *H10D 84/0128* (2025.01); *H10D 84/013* (2025.01); *H10D 84/014* (2025.01); *H10D 84/038* (2025.01)

(56)          References Cited

U.S. PATENT DOCUMENTS

| | | | |
|---|---|---|---|
| 10,573,747 | B2 | 2/2020 | Steigerwald et al. |
| 10,741,660 | B2 | 8/2020 | Loubet et al. |
| 10,770,290 | B2 | 9/2020 | Lee et al. |
| 10,825,736 | B1 | 11/2020 | Zhang et al. |
| 2021/0184001 | A1 | 6/2021 | Trivedi et al. |
| 2022/0352314 | A1* | 11/2022 | Hsu ................... H10D 84/0177 |

FOREIGN PATENT DOCUMENTS

| | | |
|---|---|---|
| KR | 1020200137256 A | 12/2020 |
| KR | 1020210075471 A | 6/2021 |
| KR | 1020210075840 A | 6/2021 |

* cited by examiner

SEMICONDUCTOR DEVICE WITH MULTIPLE SHEET PATTERNS

CROSS-REFERENCE TO RELATED APPLICATION

This application claims priority to Korean Patent Application No. 10-2021-0125581, filed on Sep. 23, 2021, and all the benefits accruing therefrom under 35 U.S.C. § 119, the disclosure of which is incorporated herein by reference in its entirety.

BACKGROUND

1. Field

The present disclosure relates to a semiconductor device and/or a method of fabricating the same, and particularly, to a semiconductor device including multi-bridge channels and/or a method of fabricating the semiconductor device.

2. Description of the Related Art

As a scaling technique for increasing the density of an integrated circuit device, a multi-gate transistor has been suggested in which a fin-, nanowire-, or nanosheet-type multi-channel silicon body is formed on a substrate and a gate is formed on the surface of the multi-channel silicon body.

Since the multi-gate transistor uses a three-dimensional (3D) channel, scaling can be facilitated. Also, current control capability can be improved without increasing the length of the gate of the multi-gate transistor. Also, a short channel effect (SCE), which is a phenomenon where the potential of a channel region is affected by a drain voltage, can be effectively limited and/or suppressed.

SUMMARY

Embodiments of the present disclosure provide a semiconductor device including multi-gate transistors having a multi-threshold voltage implemented therein.

Embodiments of the present disclosure also provide a method of fabricating a semiconductor device including multi-gate transistors having a multi-threshold voltage implemented therein.

However, embodiments of the present disclosure are not restricted to those set forth herein. The above and other features of embodiments of the present disclosure will become more apparent to one of ordinary skill in the art to which the present disclosure pertains by referencing the detailed description of the present disclosure given below.

According to an embodiment of the present disclosure, a semiconductor device may include a substrate including a first region and a second region; a first sheet pattern and a second sheet pattern on the first region of the substrate and extending in a first direction while being spaced apart from each other; a first gate electrode extending in a second direction that intersects the first direction, the first gate electrode extending between the first sheet pattern and the second sheet pattern; a third sheet pattern and a fourth sheet pattern on the second region of the substrate and extending in a third direction while being spaced apart from each other; and a second gate electrode extending in a fourth direction that intersects the third direction, the second gate electrode extending between the third sheet pattern and the fourth sheet pattern. The first gate electrode may include a first work function controlling film and a first filling conductive film on the first work function controlling film. The first work function controlling film may fill a gap between the first sheet pattern and the second sheet pattern. The second gate electrode may include a second work function controlling film and a second filling conductive film on the second work function controlling film. The second work function controlling film may fill a gap between the third sheet pattern and the fourth sheet pattern. A distance between the third sheet pattern and the fourth sheet pattern may be greater than a distance between the first sheet pattern and the second sheet pattern.

According to an embodiment of the present disclosure, a semiconductor device may include a substrate including a first region and a second region; a first sheet pattern and a second sheet pattern on the first region of the substrate and extending in a first direction while being spaced apart from each other; a first gate electrode extending in a second direction that intersects the first direction, the first gate electrode extending between the first sheet pattern and the second sheet pattern; a third sheet pattern and a fourth sheet pattern on the second region of the substrate and extending in a third direction while being spaced apart from each other; and a second gate electrode extending in a fourth direction that intersects the third direction, the second gate electrode extending between the third sheet pattern and the fourth sheet pattern. The first gate electrode may include a first work function controlling film and a first filling conductive film on the first work function controlling film. The first work function controlling film may fill a gap between the first sheet pattern and the second sheet pattern. The second gate electrode may include a second work function controlling film and a second filling conductive film on the second work function controlling film. The second work function controlling film may fill a gap between the third sheet pattern and the fourth sheet pattern. A thickness of the second work function controlling film between the third sheet pattern and the fourth sheet patterns may be greater than a thickness of the first work function controlling film between the first sheet pattern and the second sheet pattern.

According to an embodiment of the present disclosure, a semiconductor device may include a substrate including a first region and a second region; a plurality of first active patterns on the first region of the substrate and extending in a first direction while being spaced apart from each other; a first gate electrode extending in a second direction that intersects the first direction, the first gate electrode extending between the plurality of first active patterns; first source/drain regions connected to the plurality of first active patterns and on side surfaces of the first gate electrode; a plurality of second active patterns on the second region of the substrate and extending in a third direction while being spaced apart from each other; and a second gate electrode extending in a fourth direction that intersects the third direction, the second gate electrode extending between the plurality of second active patterns. The first gate electrode may include a first work function controlling film and a first filling conductive film on the first work function controlling film. The first work function controlling film may surround each of the plurality of first active patterns and may fills gap between the plurality of first active patterns. The second gate electrode may include a second work function controlling film and a second filling conductive film on the second work function controlling film. The second work function controlling film may surround each of the plurality of second active patterns and may fill gaps between the plurality of second active patterns. A distance between the plurality of second active patterns may be greater than a distance between the plurality of first active patterns.

Other features and embodiments may be apparent from the following detailed description, the drawings, and the claims.

BRIEF DESCRIPTION OF THE DRAWINGS

The above and other embodiments and features of the present disclosure will become more apparent by describing in detail embodiments thereof with reference to the attached drawings, in which:

FIGS. 4 and 5 are cross-sectional views of a semiconductor device according to some embodiments of the present disclosure.

FIGS. 6 and 7 are cross-sectional views of a semiconductor device according to some embodiments of the present disclosure.

FIGS. 8 and 9 are cross-sectional views of a semiconductor device according to some embodiments of the present disclosure.

FIG. 10 illustrates perspective views of a semiconductor device according to some embodiments of the present disclosure.

FIG. 11 illustrates cross-sectional views taken along lines C1-C1 and C2-C2 of FIG. 10.

FIGS. 12 through 26 are perspective views or cross-sectional views illustrating a method of fabricating a semiconductor device according to some embodiments of the present disclosure.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

A semiconductor device according to some embodiments of the present disclosure will hereinafter be described with reference to FIGS. 1 through 11. It will be understood that, although the terms "first", "second", etc. may be used herein to describe various elements, these elements should not be limited by these terms. These terms are only used to distinguish one element from another element. Thus, for example, a first element, a first component, or a first section discussed below could be termed a second element, a second component or a second section without departing from the teachings of the present disclosure.

Figure 1:
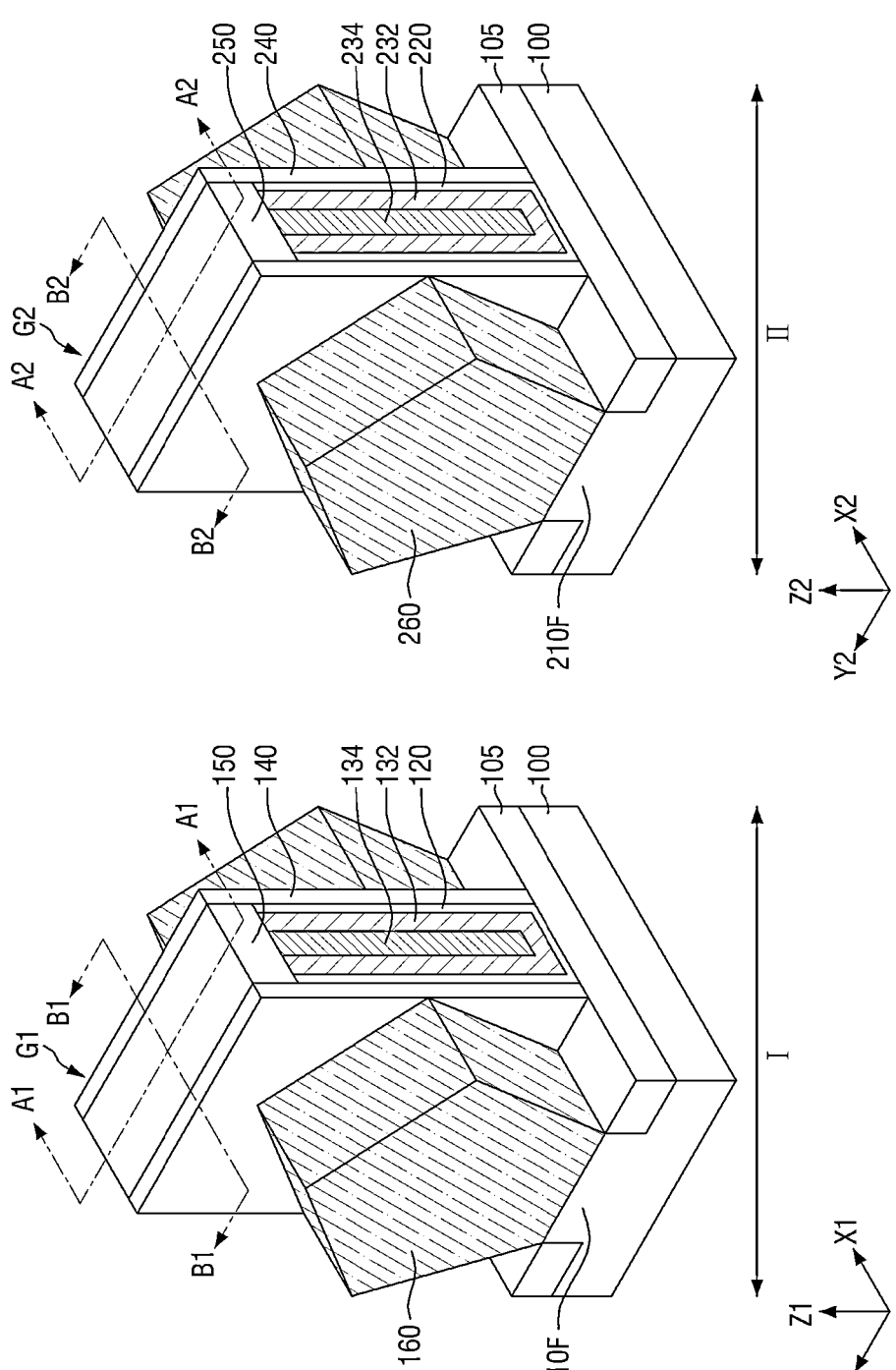
FIG. 1 illustrates perspective views of a semiconductor device according to some embodiments of the present disclosure.
Figure 2:
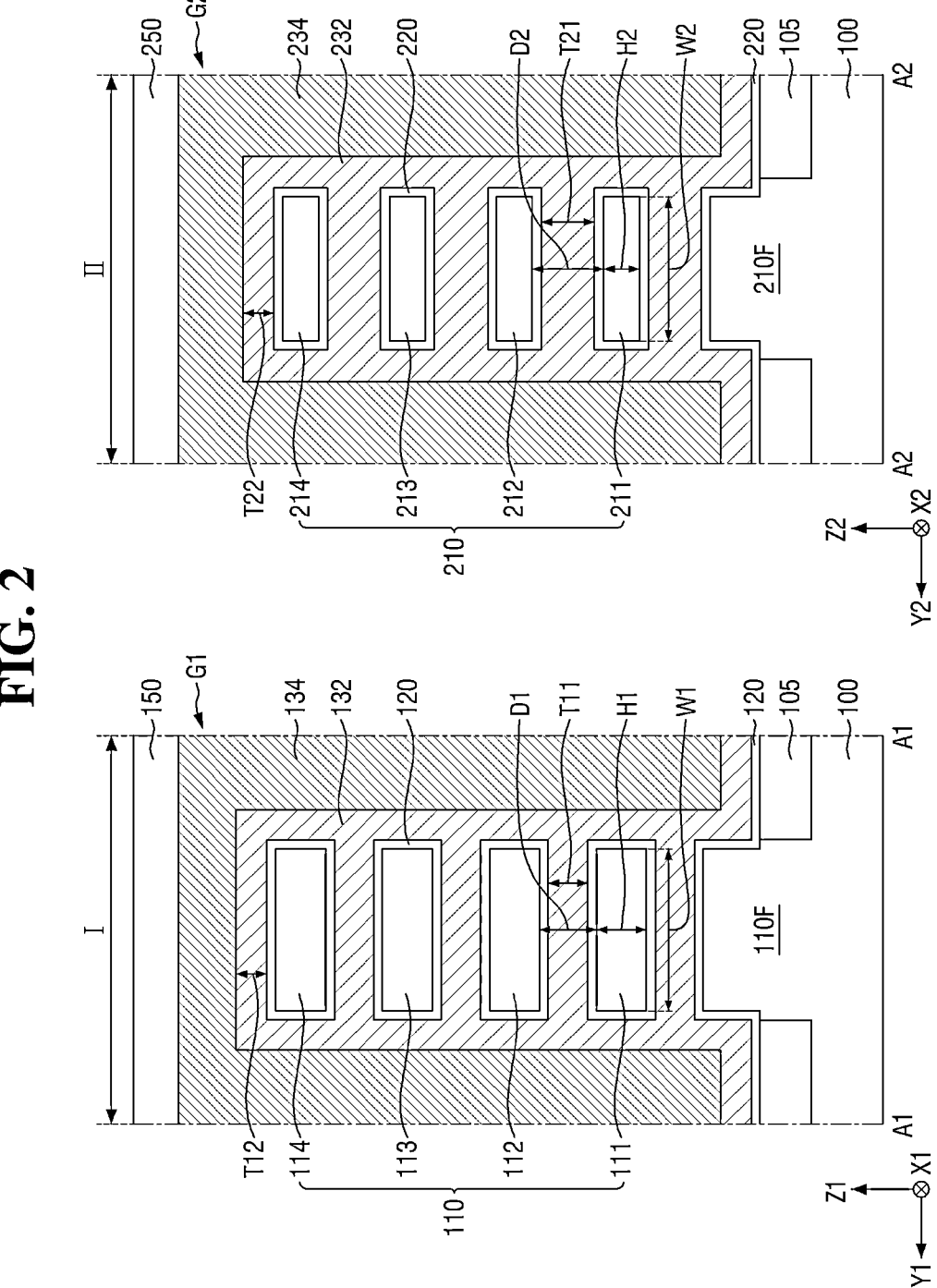
FIG. 2 illustrates cross-sectional views taken along line A1-A1 and A2-A2 of FIG. 1.
Figure 3:
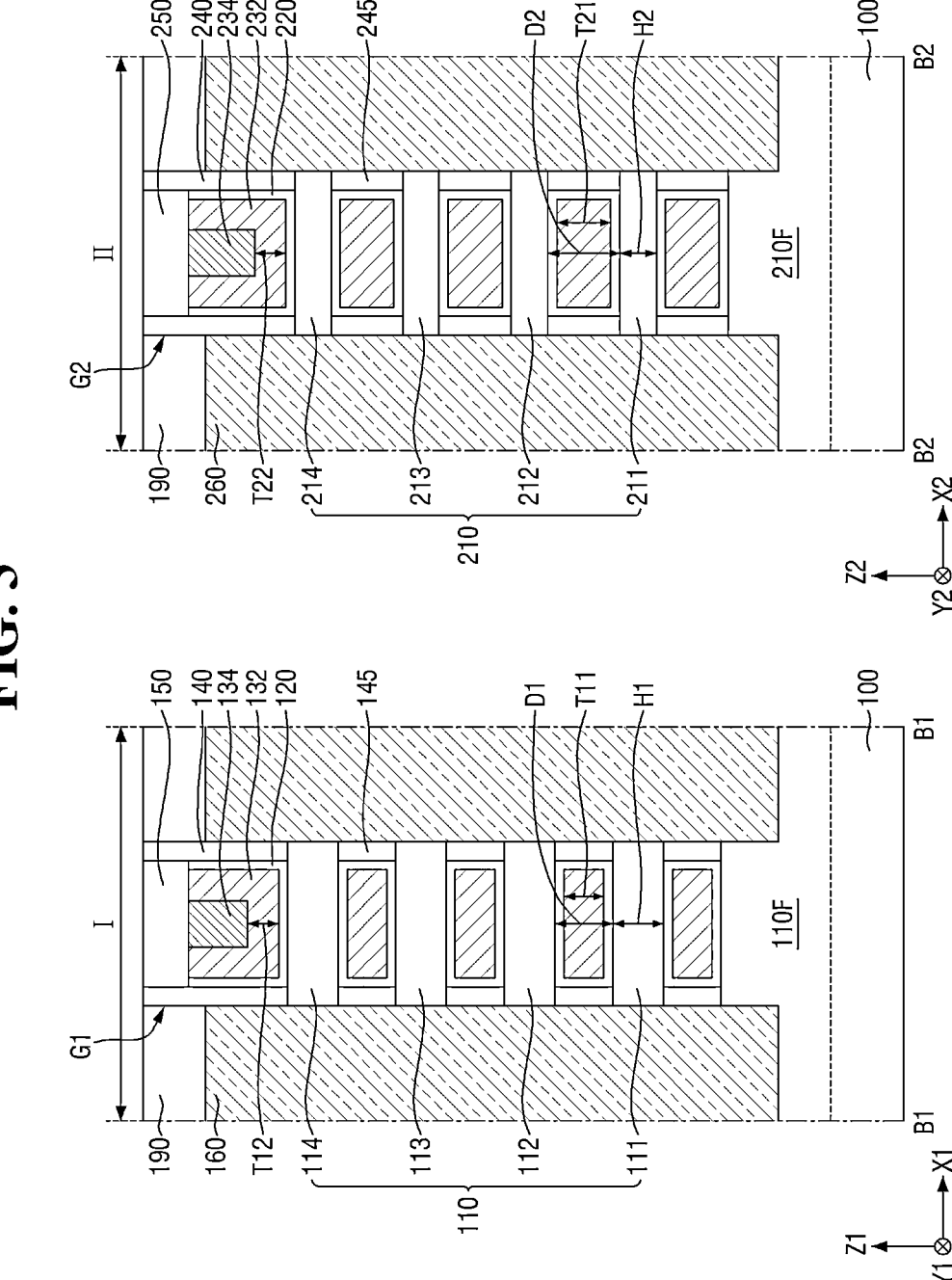
FIG. 3 illustrates cross-sectional views taken along line B1-B1 and B2-B2 of FIG. 1.

FIG. 1 illustrates perspective views of a semiconductor device according to some embodiments of the present disclosure. FIG. 2 illustrates cross-sectional views taken along line A1-A1 and A2-A2 of FIG. 1. FIG. 3 illustrates cross-sectional views taken along line B1-B1 and B2-B2 of FIG. 1.

Referring to FIGS. 1 through 3, the semiconductor device according to some embodiments of the present disclosure includes a substrate 100, a field insulating film 105, a plurality of first active patterns 110, a plurality of second active patterns 210, a first gate structure G1, a second gate structure G2, first source/drain regions 160, second source/drain regions 260, and an interlayer insulating film 190. For clarity, the interlayer insulating film 190 is not illustrated in FIG. 1.

The substrate 100 may be a silicon (Si) substrate or a silicon-on-insulator (SOI) substrate. Alternatively, the substrate 100 may include silicon-germanium (SiGe), SiGe-on-insulator (SGOI), indium antimonide, a lead tellurium compound, indium arsenide, indium phosphide, gallium arsenide, or gallium antimonide. Alternatively, the substrate 100 may be an epitaxial layer formed on a base substrate. For convenience, the substrate 100 will hereinafter be described as being a Si substrate.

The substrate 100 may include first and second regions I and II. The first and second regions I and II may be connected to each other or may be spaced apart from each other. Transistors of the same conductivity type may be formed in both the first and second regions I and II, or transistors of different conductivity types may be formed on the first and second regions I and II. The first and second regions I and II may be, for example, logic areas, static random-access memory (SRAM) areas, and/or input/output (I/O) areas. The first and second regions I and II may perform the same function or may perform different functions.

The first active patterns 110 may be sequentially disposed on the first region I of the substrate 100. The first active patterns 110 may be spaced apart from the substrate 100. The first active patterns 110 may be spaced apart from one another to extend in a first direction X1, which is parallel to the top surface of the substrate 100. In some embodiments, the first active patterns 110 may include first through fourth sheet patterns 111 through 114, which are sequentially disposed on the first region I of the substrate 110 and are spaced apart from one another.

In some embodiments, a first fin pattern 110F may be formed between the substrate 100 and the first active patterns 110. The first fin pattern 110F may protrude from the top surface of the substrate 110 to extend in the first direction X1. The first fin pattern 110F may be formed by partially etching the substrate 100 or may be an epitaxial layer grown from the substrate 100.

The second active patterns 210 may be sequentially disposed on the second region II of the substrate 100. The second active patterns 210 may be spaced apart from the substrate 100. The second active patterns 210 may be spaced apart from one another to extend in a third direction X1, which is parallel to the top surface of the substrate 100. The third direction X2 may be the same as the first direction X1. In some embodiments, the second active patterns 210 may include fifth through eighth sheet patterns 211 through 214, which are sequentially disposed on the second region II of the substrate 110 and are spaced apart from one another.

In some embodiments, a second fin pattern 210F may be formed between the substrate 100 and the second active patterns 210. The second fin pattern 210F may protrude from the top surface of the substrate 110 to extend in the first direction X1. The second fin pattern 210F may be formed by partially etching the substrate 100 or may be an epitaxial layer grown from the substrate 100.

The first active patterns 110 and the second active patterns 210 may include an element semiconductor material such as, for example, Si or germanium (Ge). Alternatively, the first active patterns 110 and the second active patterns 210 may include a compound semiconductor such as, for example, a group IV-IV compound semiconductor or a group III-V compound semiconductor. The group IV-IV compound semiconductor may be, for example, a binary or ternary compound including at least two of C, Si, Ge, and tin (Sn) or a compound obtained by doping the binary or ternary compound with a group IV element. The group III-V compound semiconductor may be, for example, a binary, ternary, quaternary compound obtained by combining at least one group III element such as aluminum (Al), gadolinium (Gd), and indium (In) with a group IV element such as phosphorus (P), arsenic (As), or antimony (Sb).

The second active patterns 210 may have a reduced size from that of the first active patterns 110. For example, as illustrated in FIGS. 2 and 3, a thickness H1 of the first sheet pattern 111 may be less than a thickness H2 of the fifth sheet pattern 211, and a width W2 of the fifth sheet pattern 211 may be less than a width W1 of the first sheet pattern 111.

The difference (e.g., H1-H2) between the thickness of the first active patterns 110 and the thickness of the second active patterns 210 may be, for example, about 0.1 nm to about 3 nm. For example, the difference (e.g., H1-H2) between the thickness of the first active patterns 110 and the thickness of the second active patterns 210 may be about 0.5 nm to about 1 nm. For example, the thickness H2 of the fifth sheet pattern 211 may be about 4 nm to about 5 nm, and the thickness H1 of the first sheet pattern 111 may be about 0.5 nm to about 1 nm.

The difference (e.g., W1-W2) between the width of the first active patterns 110 and the width of the second active patterns 210 may be, for example, about 0.1 nm to about 3 nm. For example, the difference (e.g., W1-W2) between the width of the first active patterns 110 and the width of the second active patterns 210 may be about 0.5 nm to about 1 nm. In some embodiments, the difference (e.g., W1-W2) between the width of the first active patterns 110 and the width of the second active patterns 210 may be the same as the difference (e.g., H1-H2) between the thickness of the first active patterns 110 and the thickness of the second active patterns 210. The term "same", as used herein, may refer to perfectly identical or almost similar with slight differences that may be caused by, for example, process margins.

In some embodiments, the second active patterns 210 may be disposed on the same level as the first active patterns 110. The expression "on the same level", as used herein, may refer to the same height from the top surface of the substrate 100. For example, as illustrated in FIGS. 2 and 3, the centers of the first and fifth sheet patterns 211 may be at the same height from the top surface of the substrate 100, and the centers of the second and sixth sheet patterns 112 and 212 may be at the same height from the top surface of the substrate 100.

As the second active patterns 210 have a reduced size from that of the first active patterns 110, the distance between the second active patterns 210 may be greater than the distance between the first active patterns 110. For example, a distance D2 between the fifth and sixth active patterns 211 and 212 may be greater than a distance D1 between the first and second sheet patterns 111 and 112.

In some embodiments, an upper portion of the first fin pattern 110F, which protrudes from the field insulating film 105, may have a reduced size from that of a lower portion of the first fin pattern 110F. For example, as illustrated in FIG. 2, the width of the upper portion of the first fin pattern 110F may be the same as the width W1 of the first sheet pattern 111 and may be greater than the width of the lower portion of the first fin pattern 110F.

In some embodiments, an upper portion of the second fin pattern 210F, which protrudes from the field insulating film 105, may have a reduced size from that of a lower portion of the second fin pattern 210F. For example, as illustrated in FIG. 2, the width of the upper portion of the second fin pattern 210F may be the same as the width W2 of the fifth sheet pattern 211 and may be greater than the width of the lower portion of the second fin pattern 210F. In some embodiments, the width of the lower portion of the second fin pattern 210 in the field insulating film 105 may be the same as the width of the lower portion of the first fin pattern 110F in the field insulating film 105.

The field insulating film 105 may be formed on the first and second regions I and II of the substrate 100. The field insulating film 105 may cover at least parts of the side surfaces of the first fin pattern 110F and at least parts of the side surfaces of the second fin pattern 210F. The upper portions of the first and second fin patterns 110F and 210F are illustrated as protruding from the top surface of the field insulating film 105, but the present disclosure is not limited thereto. Alternatively, the top surface of the field insulating film 105 may be disposed on the same plane as the top surfaces of the first and second fin patterns 110F and 210F. The field insulating film 105 may include at least one of, for example, silicon oxide, silicon nitride, silicon oxynitride, and a combination thereof, but the present disclosure is not limited thereto.

The first gate structure G1 may be formed on the first region I of the substrate 100. The first gate structure G1 may extend along the top surfaces of the substrate 100 and the field insulating film 105. The first gate structure G1 may intersect the first active patterns 110. For example, the first gate structure G1 may extend in a second direction Y1, which is parallel to the top surface of the substrate 100 and intersects the first direction X1. The first active patterns 110 may extend in the first direction X1 to penetrate the first gate structure G1. For example, the first gate structure G1 may surround the first through fourth sheet patterns 111 through 114.

The second gate structure G2 may be formed on the second region II of the substrate 100. The second gate structure G2 may extend along the top surfaces of the substrate 100 and the field insulating film 105. The second gate structure G2 may intersect the second active patterns 210. For example, the second gate structure G2 may extend in a fourth direction Y2, which is parallel to the top surface of the substrate 100 and intersects the third direction X2. The second active patterns 210 may extend in the third direction X2 to penetrate the second gate structure G2. For example, the second gate structure G2 may surround the fifth through eighth sheet patterns 211 through 214.

The first gate structure G1 may include a first gate dielectric film 120, a first gate electrode (132 and 134), first gate spacers 140, and a first gate capping pattern 150. The second gate structure G2 may include a second gate dielectric film 220, a second gate electrode (232 and 234), second gate spacers 240, and a second gate capping pattern 250.

The first gate dielectric film 120 may be stacked on each of the first active patterns 110. The first gate dielectric film

120 may surround each of the first active patterns 110. The first gate dielectric film 120 may extend along the top surface of the field insulating film 105 and the surfaces of the first fin pattern 110F, which protrudes from the field insulating film 105.

The second gate dielectric film 220 may be stacked on each of the second active patterns 210. The second gate dielectric film 220 may surround each of the second active patterns 210. The second gate dielectric film 220 may extend along the top surface of the field insulating film 105 and the surfaces of the second fin pattern 210F, which protrudes from the field insulating film 105.

The first and second gate dielectric films 120 and 220 may include at least one of, for example, silicon oxide, silicon oxynitride, silicon nitride, or a high-k material having a greater dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

In some embodiments, the first and second gate dielectric films 120 and 220 may be formed on the same level. The expression "formed on the same level", as used herein, may mean "formed by the same manufacturing process". For example, the first and second gate dielectric films 120 and 220 may include the same material or have the same composition.

Although not specifically illustrated, an interfacial film may be formed between the first active patterns 110 and the first gate dielectric film 120 and/or between the second active patterns 210 and the second gate dielectric film 220. The interfacial fil may include, for example, a silicon oxide film, but the present disclosure is not limited thereto.

The semiconductor device according to some embodiments of the present disclosure may include negative capacitance field-effect transistors (NCFETs) using negative capacitors. For example, the first gate dielectric film 120 and/or the second gate dielectric film 220 may include ferroelectric material films having ferroelectric properties and paraelectric material films having paraelectric properties.

The ferroelectric material films may have negative capacitance, and the paraelectric material films may have positive capacitance. For example, if two or more capacitors are connected in series and have positive capacitance, the total capacitance of the two or more capacitors may be lower than the capacitance of each of the two or more capacitors. On the contrary, if at least one of the two or more capacitors has negative capacitance, the total capacitance of the two or more capacitors may have a positive value and may be greater than the absolute value of the capacitance of each of the two or more capacitors.

If the ferroelectric material films having negative capacitance and the paraelectric material films having positive capacitance are connected in series, the total capacitance of the ferroelectric material films and the paraelectric material films may increase. Accordingly, transistors having the ferroelectric material films can have a sub-threshold swing (SS) of less than about 60 mV/decade at room temperature.

The ferroelectric material films may have ferroelectric properties. The ferroelectric material films may include, for example, at least one of hafnium oxide, hafnium zirconium oxide, barium strontium titanium oxide, barium titanium oxide, and lead zirconium titanium oxide. For example, the hafnium zirconium oxide may be a material obtained by doping hafnium oxide with zirconium (Zr). In another example, the hafnium zirconium oxide may be a compound of hafnium (Hf), Zr, and oxygen (O).

The ferroelectric material films may further include a dopant. For example, the dopant may include at least one of Al, Ti, Nb, lanthanum (La), yttrium (Y), magnesium (Mg), silicon, calcium (Ca), cerium (Ce), dysprosium (Dy), erbium (Er), Gd, Ge, scandium (Sc), strontium (Sr), and tin (Sn). The type of dopant may vary depending on the type of material of the ferroelectric material films.

If the ferroelectric material films include hafnium oxide, the dopant of the ferroelectric material films may include, for example, at least one of Gd, Si, Zr, Al, and Y.

If the dopant of the ferroelectric material films is Al, the ferroelectric material films may include about 3 atomic % (at %) to about 8 at % of Al. The ratio of the dopant in the ferroelectric material films may refer to the ratio of the sum of the amounts of Hf and Al to the amount of Al in the ferroelectric material films.

If the dopant of the ferroelectric material films is Si, the ferroelectric material films may include about 2 at % to about 10 at % of Si. If the dopant of the ferroelectric material films is Y, the ferroelectric material films may include 2 at % to 10 at % of Y. If the dopant of the ferroelectric material films is Gd, the ferroelectric material films may include 1 at % to 7 at % of Gd. If the dopant of the ferroelectric material films is Zr, the ferroelectric material films may include 50 at % to 80 at % of Zr.

The paraelectric material films may include paraelectric properties. The paraelectric material films may include, for example, at least one of silicon oxide and a high-k metal oxide. The high-k metal oxide may include, for example, at least one of hafnium oxide, zirconium oxide, and aluminum oxide, but the present disclosure is not limited thereto.

The ferroelectric material films and the paraelectric material films may include the same material. The ferroelectric material films may have ferroelectric properties, but the paraelectric material films may not have ferroelectric properties. For example, if the ferroelectric material films and the paraelectric material films include hafnium oxide, the hafnium oxide included in the ferroelectric material films may have a different crystalline structure from the hafnium oxide included in the paraelectric material films.

The ferroelectric material films may be thick enough to exhibit ferroelectric properties. The ferroelectric material films may have a thickness of, for example, 0.5 nm to 10 nm, but the present disclosure is not limited thereto. A critical thickness that can exhibit ferroelectric properties may vary depending on the type of ferroelectric material, and thus, the thickness of the ferroelectric material films may vary depending on the type of ferroelectric material included in the ferroelectric material films.

For example, the first gate dielectric film 120 and/or the second gate dielectric film 220 may include one ferroelectric material film. In another example, the first gate dielectric film 120 and/or the second gate dielectric film 220 may include a plurality of ferroelectric material films that are spaced apart from one another. The first gate dielectric film 120 and/or the second gate dielectric film 220 may have a structure in which a plurality of ferroelectric material films and a plurality of paraelectric material films are alternately stacked.

The first gate electrode (132 and 134) may be stacked on the first gate dielectric film 120. That is, the first gate dielectric film 120 may be interposed between the first active patterns 110 and the first gate electrode (132 and 134). The first gate dielectric film 120 may be interposed between the first fin pattern 110F and the first gate electrode (132 and 134). The first gate electrode (132 and 134) may be formed by, for example, a replacement process, but the present disclosure is not limited thereto.

The first gate electrode (132 and 134) may include a first work function controlling film 132 and a first filling conductive film 134, which fills the spaces formed by the first work function controlling film 132. The first work function controlling film 132 and the first filling conductive film 134 may be sequentially stacked on each of the first active patterns 110.

The first work function controlling film 132 may surround the first active patterns 110. The first work function controlling film 132 may fill the gaps between the first active patterns 110. For example, the first work function controlling film 132 may fill the gap between the first and second sheet patterns 111 and 112. The first filling conductive film 134 may be deposited on the first work function controlling film 132. The first filling conductive film 134 may fill the rest of the first electrode (132 and 134) that is not filled with the first work function controlling film 132. As the first work function controlling film 132 fills the gaps between the first active patterns 110, the first filling conductive film 134 may not be interposed between the first active patterns 110.

The second gate electrode (232 and 234) may be stacked on the second gate dielectric film 220. That is, the second gate dielectric film 220 may be interposed between the second active patterns 210 and the second gate electrode (232 and 234). The second gate dielectric film 220 may be interposed between the second fin pattern 210F and the second gate electrode (232 and 234). The second gate electrode (232 and 234) may be formed by, for example, a replacement process, but the present disclosure is not limited thereto.

The second gate electrode (232 and 234) may include a second work function controlling film 232 and a second filling conductive film 234, which fills the spaces formed by the second work function controlling film 232. The second work function controlling film 232 and the second filling conductive film 234 may be sequentially stacked on each of the second active patterns 210.

The second work function controlling film 232 may surround the second active patterns 210. The second work function controlling film 232 may fill the gaps between the second active patterns 210. For example, the second work function controlling film 232 may fill the gap between the fifth and sixth sheet patterns 211 and 212. The second filling conductive film 234 may be deposited on the second work function controlling film 132. The second filling conductive film 234 may fill the rest of the second gate electrode (232 and 234) that is not filled with the second work function controlling film 232. As the second work function controlling film 232 fills the gaps between the second active patterns 210, the second filling conductive film 234 may not be interposed between the second active patterns 210.

The first and second work function controlling films 132 and 232 may include at least one of, for example, TiN, TaN, TiC, TaC, TiON, TiAlC, TiAlN, and a combination thereof, but the present disclosure is not limited thereto. The first and second filling conductive films 134 and 234 may include, for example, W or Al, but the present disclosure is not limited thereto.

In some embodiments, the first and second work function controlling films 132 and 232 may be formed on the same level. For example, the first and second work function controlling films 132 and 232 may include the same material or have the same composition.

In some embodiments, the first and second filling conductive films 134 and 234 may be formed on the same level. For example, the first and second filling conductive films 134 and 234 may include the same material or have the same composition.

As the second active patterns 210 have a reduced size from that of the first active patterns 110, the thickness of the second work function controlling film 232, which fills the gaps between the second active patterns 210, may be greater than the thickness of the first work function controlling film 132, which fills the first active patterns 110. For example, a thickness T21 of the second work function controlling film 232 between the fifth and sixth sheet patterns 211 and 212 may be greater than a thickness T11 of the first work function controlling film 132 between the first and second sheet patterns 111 and 112.

In some embodiments, a thickness T12 of the first work function controlling film 132 above the first active patterns 110 may be greater than half the thickness T11 of the first work function controlling film 132 between the first active patterns 110, e.g., T11/2. As a result, the first work function controlling film 132, which is conformally formed on the first active patterns 110, may completely fill the gaps between the first active patterns 110.

In some embodiments, a thickness T22 of the second work function controlling film 232 above the second active patterns 210 may be greater than half the thickness T21 of the second work function controlling film 232 between the second active patterns 210, e.g., T21/2. As a result, the second work function controlling film 232, which is conformally formed on the second active patterns 210, may completely fill the gaps between the second active patterns 210.

In some embodiments, the thickness T22 of the second work function controlling film 232 above the second active patterns 210 may be the same as the thickness T12 of the first work function controlling film 132 above the first active patterns 110. For example, the first and second work function controlling films 132 and 232 may be formed on the same level.

The first gate spacers 140 may be formed on the substrate 100 and the field insulating film 105. The first gate spacers 140 may extend along the side surfaces of the first gate electrode (132 and 134). In some embodiments, the first gate dielectric film 120 may be interposed between the first gate electrode (132 and 314) and the first gate spacers 140. For example, the first gate dielectric film 120 may extend further along at least parts of the inner side surfaces of the first gate spacers 140. The first gate dielectric film 120 may be formed by, for example, a replacement process, but the present disclosure is not limited thereto.

The second gate spacers 240 may be formed on the substrate 100 and the field insulating film 105. The second gate spacers 240 may extend along the side surfaces of the second gate electrode (232 and 234). In some embodiments, the second gate dielectric film 220 may be interposed between the second gate electrode (232 and 234) and the second gate spacers 240. For example, the second gate dielectric film 220 may extend further along at least parts of the inner side surfaces of the second gate spacers 240. The second gate dielectric film 220 may be formed by, for example, a replacement process, but the present disclosure is not limited thereto.

The first gate spacers 140 and the second gate spacers 240 may include at least one of, for example, silicon nitride, silicon oxynitride, silicon oxycarbide, silicon boron nitride, silicon boron carbonitride, silicon oxycarbonitride, and a combination thereof, but the present disclosure is not limited thereto.

The first gate capping pattern 150 may be formed on the first gate electrode (132 and 134). The first gate capping pattern 150 may extend along the top surface of the first gate electrode (132 and 134). The top surface of the first gate spacers 140 may be disposed on the same plane as the top surface of the first gate capping pattern 150, but the present disclosure is not limited thereto. Alternatively, the first gate capping pattern 150 may be formed to cover the top surfaces of the first gate spacers 140.

The second gate capping pattern 250 may be formed on the second gate electrode (232 and 234). The second gate capping pattern 250 may extend along the top surface of the second gate electrode (232 and 234). The top surface of the second gate spacers 240 may be disposed on the same plane as the top surface of the second gate capping pattern 250, but the present disclosure is not limited thereto. Alternatively, the second gate capping pattern 250 may be formed to cover the top surfaces of the second gate spacers 240.

The first and second gate capping patterns 150 and 250 may include at least one of, for example, silicon nitride, silicon oxynitride, silicon oxycarbide, silicon boron nitride, silicon boron carbonitride, silicon oxycarbonitride, and a combination thereof, but the present disclosure is not limited thereto.

The first source/drain regions 160 may be formed on the top surface of the substrate 100 and on at least one side (e.g., on both sides) of the first gate structure G1. The first source/drain regions 160 may be connected to the first active patterns 110. For example, the first through fourth sheet patterns 111 through 114 may be connected to the first source/drain regions 160 through the first gate structure G1. The first source/drain regions 160 may be separated from the first gate electrode (132 and 134) by the first gate dielectric film 120 and/or the first gate spacers 140.

In some embodiments, first inner spacers 145 may be formed on the side surfaces of the first gate electrode (132 and 134) between the first active patterns 110. Also, the first inner spacers 145 may be formed between the first fin pattern 110F and the first active patterns 110 (e.g., between the first fin pattern 110F and the first sheet pattern 111). The first gate electrode (132 and 134) may be separated from the first source/drain regions 160, between the first active patterns 110, by the first gate dielectric film 120 and/or the first inner spacers 145. The thickness of the first inner spacers 145 is illustrated as being the same as the thickness of the first gate spacers 140, but the present disclosure is not limited thereto. In other embodiments, the first inner spacers 145 may not be provided.

The second source/drain regions 260 may be formed on the top surface of the substrate 100 and on at least one side (e.g., on both sides) of the second gate structure G2. The second source/drain regions 260 may be connected to the first active patterns 110. For example, the fifth through eighth sheet patterns 211 through 214 may be connected to the second source/drain regions 260 through the second gate structure G2. The second source/drain regions 260 may be separated from the second gate electrode (232 and 234) by the second gate dielectric film 220 and/or the second gate spacers 240.

In some embodiments, second inner spacers 245 may be formed on the side surfaces of the second gate electrode (232 and 234) between the first active patterns 110. Also, the second inner spacers 245 may be formed between the second fin pattern 210F and the second active patterns 210 (e.g., between the second fin pattern 210F and the fifth sheet pattern 211). The second gate electrode (232 and 234) may be separated from the second source/drain regions 260, between the second active patterns 210, by the second gate dielectric film 220 and/or the second inner spacers 245. The thickness of the second inner spacers 245 is illustrated as being the same as the thickness of the second gate spacers 240, but the present disclosure is not limited thereto. In other embodiments, the second inner spacers 245 may not be provided.

The first source/drain regions 160 and the second source/drain regions 260 may include epitaxial layers. For example, the first source/drain regions 160 and the second source/drain regions 260 may be formed by epitaxial growth. FIG. 1 illustrates that the first source/drain regions 160 and the second source/drain regions 260 have a pentagonal cross-sectional shape, but the present disclosure is not limited thereto. The cross-sectional shape of the first source/drain regions 160 and the second source/drain regions 260 may vary depending on a set of conditions for epitaxial growth.

In a case where n-type transistors (e.g., n-type field-effect transistors (NFETs)) are formed on the first region I and/or the second region II, the first source/drain regions 160 and/or the second source/drain regions 260 may include n-type impurities or impurities for limiting and/or preventing the diffusion of n-type impurities. For example, the first source/drain regions 160 and/or the second source/drain regions 260 may include at least one of P, Sb, As, and a combination thereof.

In some embodiments, in a case where n-type transistors (e.g., NFETs) are formed on the first region I and/or the second region II, the first source/drain regions 160 and/or the second source/drain regions 260 may include a tensile stress material. For example, in a case where the first active patterns 110 and/or the second active patterns 210 are Si patterns, the first source/drain regions 160 and/or the second source/drain regions 260 may include a material (e.g., silicon carbide (SiC)) having a smaller lattice constant than Si. The tensile stress material may improve carrier mobility in channel regions by applying tensile stress to the first active patterns 110 and/or the second active patterns 210.

In a case where p-type transistors (e.g., p-type field-effect transistors (PFETs)) are formed on the first region I and/or the second region II, the first source/drain regions 160 and/or the second source/drain regions 260 may include p-type impurities or impurities for limiting and/or preventing the diffusion of p-type impurities. For example, the first source/drain regions 160 and/or the second source/drain regions 260 may include at least one of B, C, In, Ga, Al, and a combination thereof.

In some embodiments, in a case where p-type transistors (e.g., PFETs) are formed on the first region I and/or the second region II, the first source/drain regions 160 and/or the second source/drain regions 260 may include a compressive stress material. For example, in a case where the first active patterns 110 and/or the second active patterns 210 are Si patterns, the first source/drain regions 160 and/or the second source/drain regions 260 may include a material (e.g., SiGe) having a greater lattice constant than Si. The compressive stress material may improve carrier mobility in channel regions by applying compressive stress to the first active patterns 110 and/or the second active patterns 210.

The interlayer insulating film 190 may be formed on the substrate 100 and the field insulating film 105. The interlayer insulating film 190 may be formed to fill the space on the outside of the outer side surfaces of the first gate spacers 140 and the space on the outside of the outer side surfaces of the second gate spacers 240. For example, the interlayer insulating film 190 may cover the field insulating film 105, the first source/drain regions 160, and the second source/drain regions 260. The interlayer insulating film 190 is illustrated as exposing only the top surfaces of the first and second gate structures G1 and G2, but the present disclosure is not limited thereto. Alternatively, the interlayer insulating film 190 may also cover the top surfaces of the top surfaces of the first and second gate structures G1 and G2.

The interlayer insulating film 190 may include at least one of, for example, silicon oxide, silicon nitride, silicon oxynitride, silicon oxycarbide, silicon boron nitride, silicon boron carbonitride, silicon oxycarbonitride, and a low-k material. The low-k material may include at least one of, for example, flowable oxide (FOX), tonen silazane (TOSZ), undoped silicate glass (USG), borosilicate glass (BSG), phosphosilicate glass (PSG), borophosphosilicate glass (BPS G), plasma-enhanced tetraethylorthosilicate (PETEOS), fluoride silicate glass (FSG), carbon-doped silicon oxide (CDO), xerogel, aerogel, amorphous fluorinated carbon, organo silicate glass (OSG), parylene, bis-benzocyclobutene (BCB), SiLK, polyimide, a porous polymeric material, and a combination thereof, but the present disclosure is not limited thereto.

The semiconductor device according to some embodiments of the present disclosure can realize a multi-threshold voltage in multi-gate transistors by using the first and second work function controlling films 132 and 232. For example, as already mentioned above, as the second active patterns 210 have a reduced size from that of the first active patterns 110, the thickness T21 of the second work function controlling film 232, which fills the gaps between the second active patterns 210 may be greater than the thickness T11 of the first work function controlling film 132, which fills the gaps between the first active patterns 110. Accordingly, the first and second work function controlling films 132 and 232 may have different effective work functions (EWFs).

Figure 4:
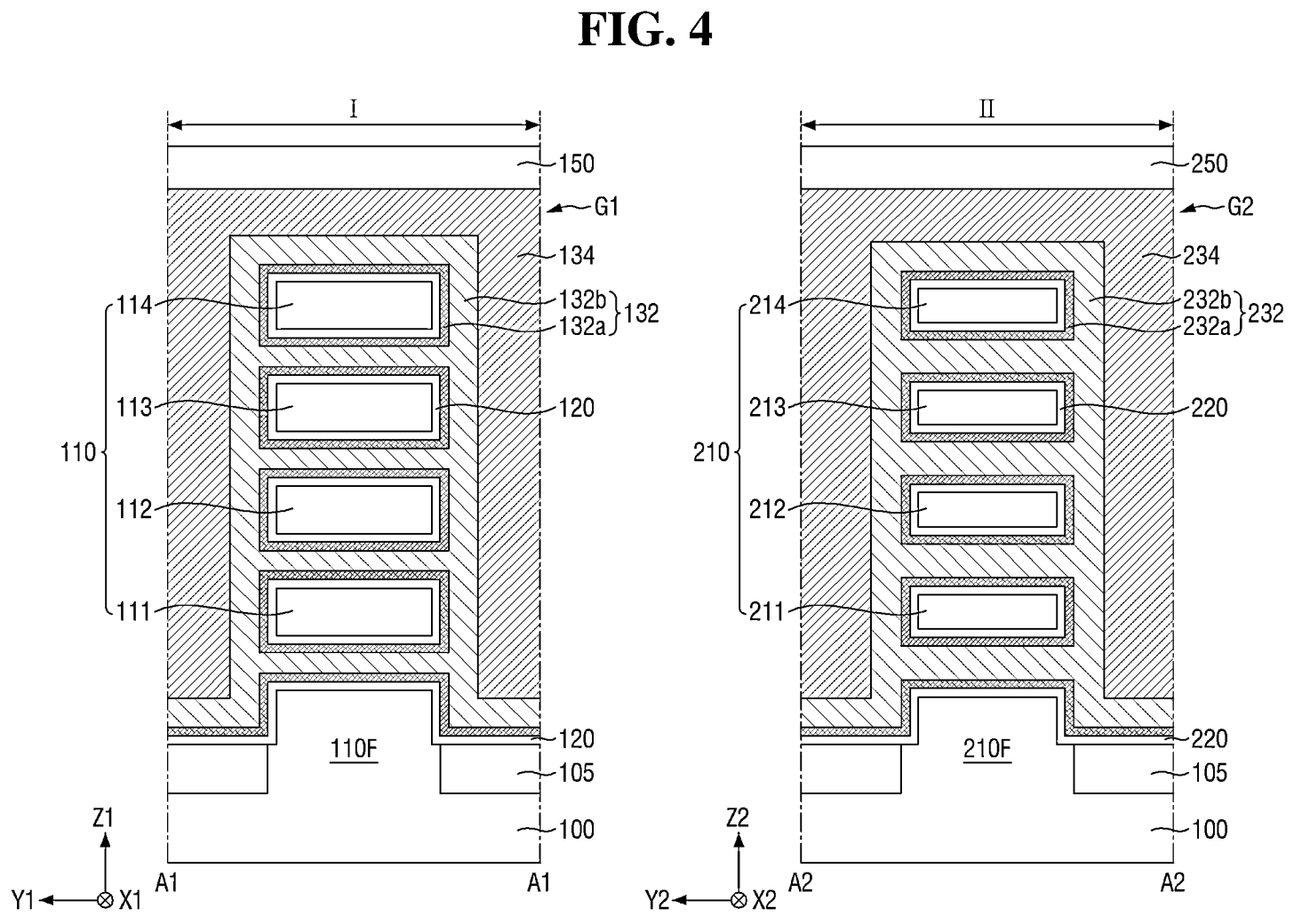
Figure 5:
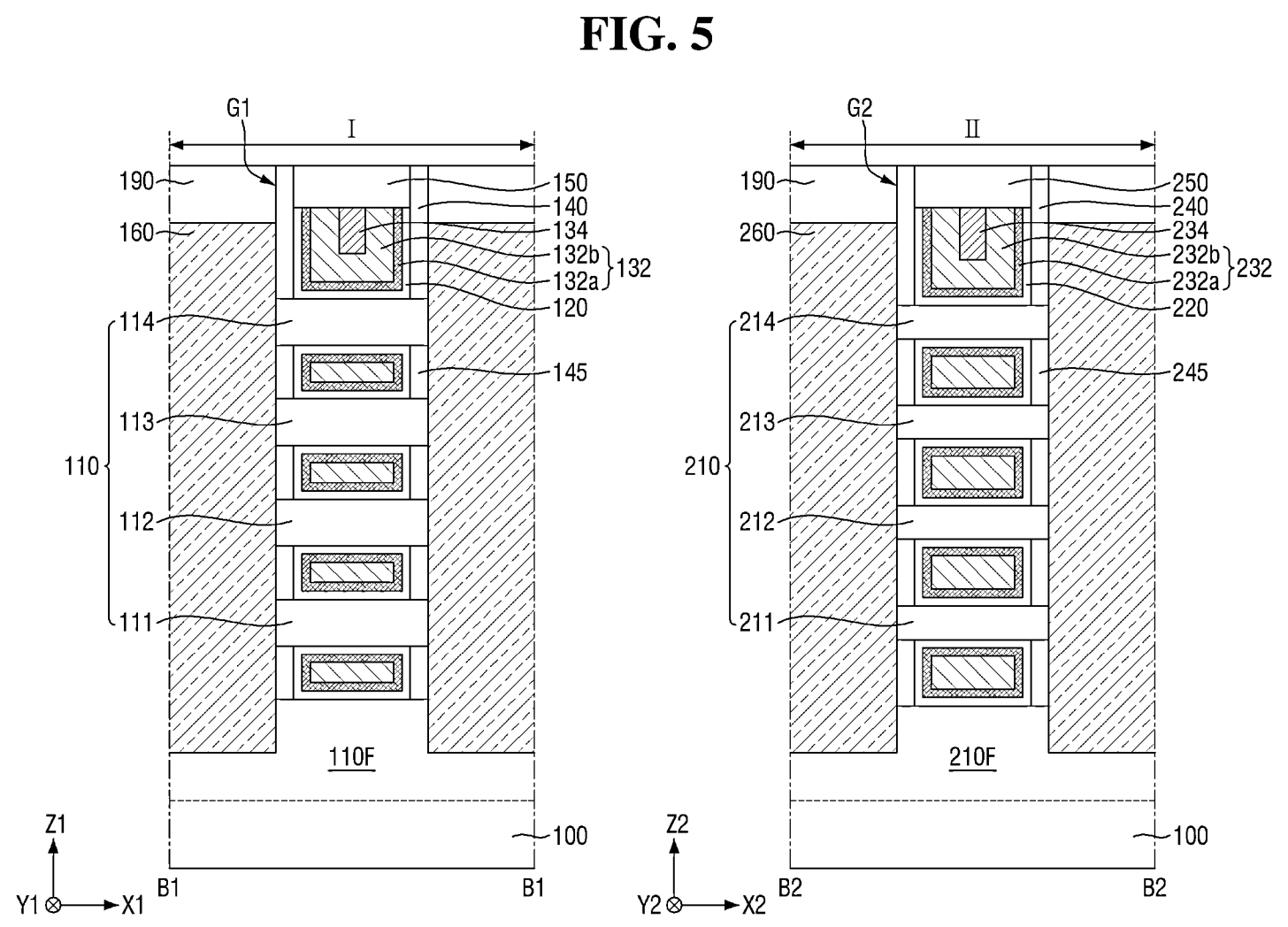

FIGS. 4 and 5 are cross-sectional views of a semiconductor device according to some embodiments of the present disclosure. For convenience, the semiconductor device according to some embodiments of the present disclosure will hereinafter be described, focusing mainly on the differences with the semiconductor device of FIGS. 1 through 3. FIG. 4 illustrates cross-sectional views taken along lines A1-A1 and A2-A2 of FIG. 1, and FIG. 5 illustrates cross-sectional views taken along lines B1-B1 and B2-B2 of FIG. 1.

Referring to FIGS. 4 and 5, first and second work function controlling films 132 and 232 may be formed as multilayers.

For example, the first work function controlling film 132 may include first and second sub-work function controlling films 132a and 132b, which are sequentially stacked on each of first active patterns 110. For example, the second work function controlling film 232 may include third and fourth sub-work function controlling films 232a and 232b, which are sequentially stacked on each of second active patterns 210.

The first and second sub-work function controlling films 132a and 132b may include a material capable of controlling the work function of the first gate electrode (132 and 134), such as, for example, TiN, TaN, TiC, TaC, TiON, TiAlC, TiAlN, and a combination thereof, but the present disclosure is not limited thereto. The third and fourth sub-work function controlling films 232a and 232b may include a material capable of controlling the work function of the second gate electrode (232 and 234), such as, for example, TiN, TaN, TiC, TaC, TiON, TiAlC, TiAlN, and a combination thereof, but the present disclosure is not limited thereto.

In some embodiments, the first and third sub-work function controlling films 132a and 232a may be formed on the same level, and the second and fourth sub-work function controlling films 132b and 232b may be formed on the same level.

In some embodiments, the first sub-work function controlling film 132a may extend conformally along each of the first active patterns 110, and the second sub-work function controlling film 132b may fill the gaps between the first active patterns 110. In some embodiments, the third sub-work function controlling film 232a may extend conformally along each of the second active patterns 210, and the fourth sub-work function controlling film 232b may fill the gaps between the second active patterns 210.

As the second active patterns 210 have a reduced size from the first active patterns 110, the thickness of the fourth sub-work function controlling film 232b between the second active patterns 210 may be greater than the thickness of the second sub-work function controlling film 132b between the first active patterns 110.

In some embodiments, first and second regions I and II may both be NFET regions. For example, the first and second work function controlling films 132 and 232 may include n-type work function controlling films. For example, the first and third sub-work function controlling films 132a and 232a may include TiN films, and the second and fourth sub-work function controlling films 132b and 232b may include TiAlC films.

Figure 6:
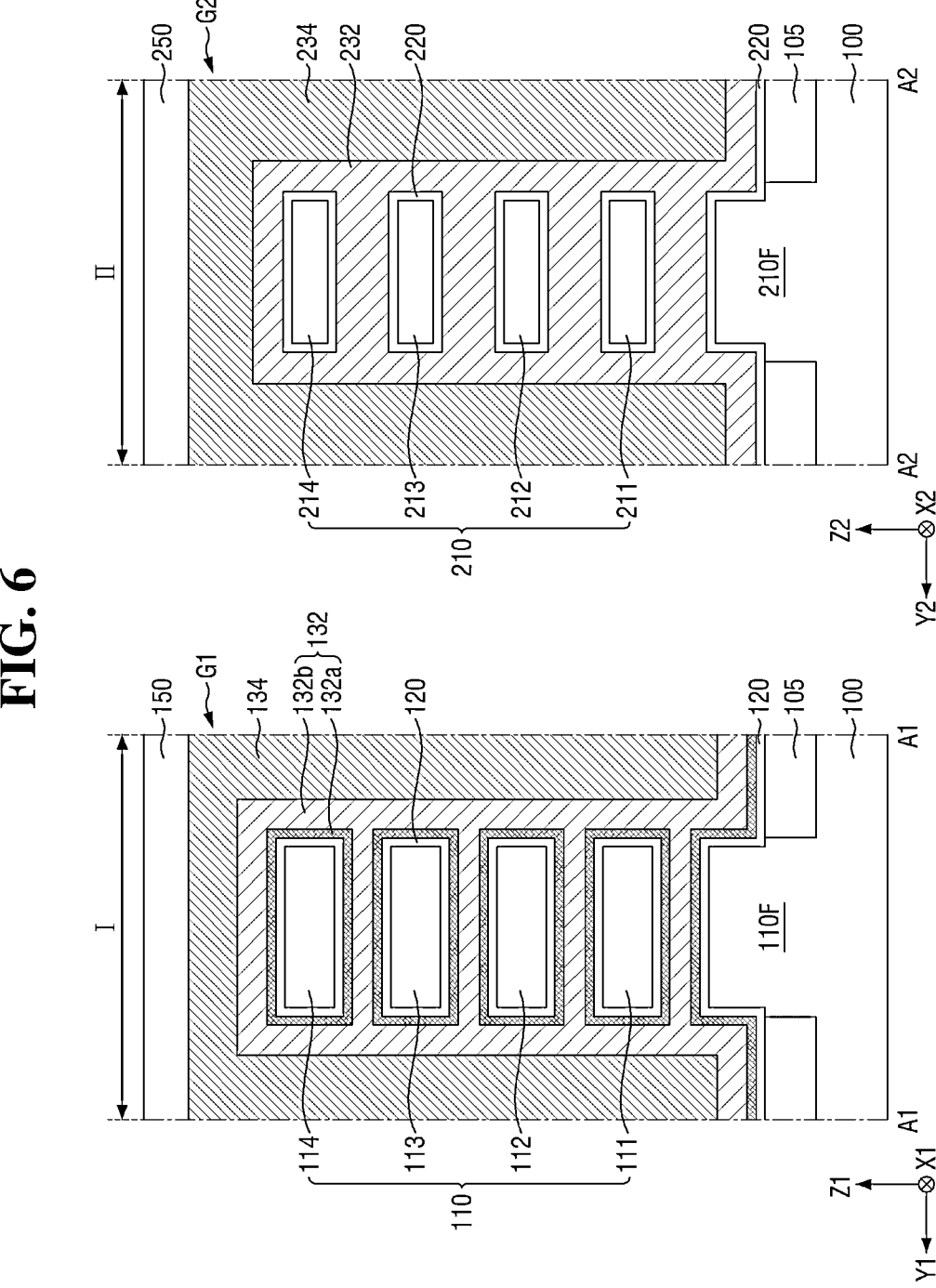
Figure 7:
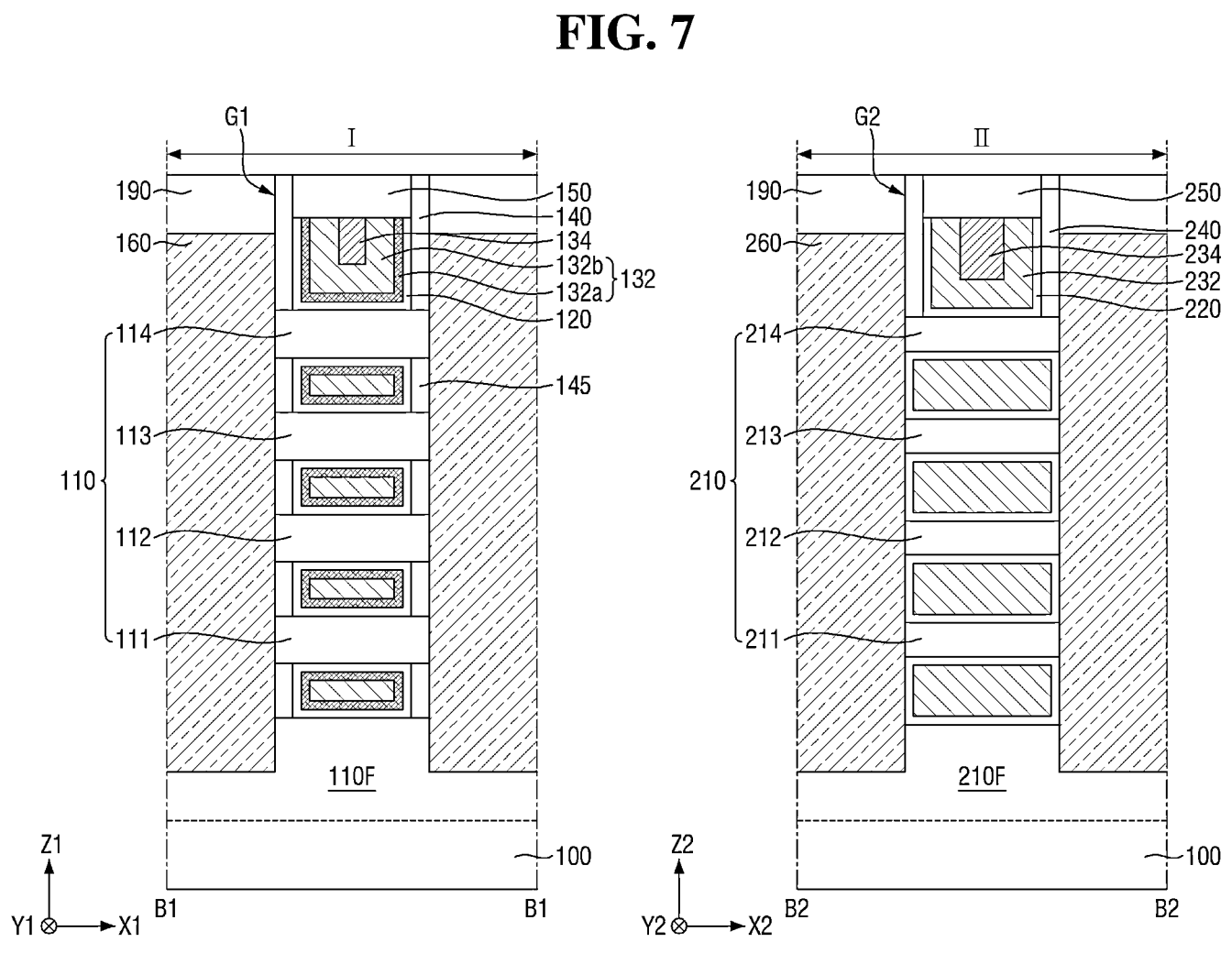

FIGS. 6 and 7 are cross-sectional views of a semiconductor device according to some embodiments of the present disclosure. For convenience, the semiconductor device according to some embodiments of the present disclosure will hereinafter be described, focusing mainly on the differences with the semiconductor device of any one of FIGS. 1 through 5. FIG. 6 illustrates cross-sectional views taken along lines A1-A1 and A2-A2 of FIG. 1, and FIG. 7 illustrates cross-sectional views taken along lines B1-B1 and B2-B2 of FIG. 1.

Referring to FIGS. 6 and 7, a first region I may be an NFET region, and a second region II may be a PI-BT region.

For example, a first work function controlling film 132 may include an n-type work function controlling film, and a second work function controlling film 232 may include a p-type work function controlling film. In some embodiments, the first work function controlling film 132 may be formed as a multilayer including first and second sub-work function controlling films 132a and 132b. For example, the first sub-work function controlling film 132a may include a TiN film, and the second sub-work function controlling film 132b may include a TiAlC film. In some embodiments, the second work function controlling film 232 may be formed as a single layer. For example, the second work function controlling film 232 may include a TiN film or a TiAlN film.

In some embodiments, first inner spacers 145 may be formed on the side surfaces of a first gate electrode (132 and 134) between first active patterns 110. The first gate electrode (132 and 134) between the first active patterns 110 may be separated from first source/drain regions 160 by a first gate dielectric film 120 and/or the first inner spacers 145.

In some embodiments, inner spacers (e.g., the second inner spacers 245 of FIG. 3) may not be formed on the side surfaces of a second gate electrode (232 and 234) between second active patterns 210. The second gate electrode (232 and 234) between the second active patterns 210 may be separated from second source/drain regions 260 by a second gate dielectric film 220.

Figure 8:
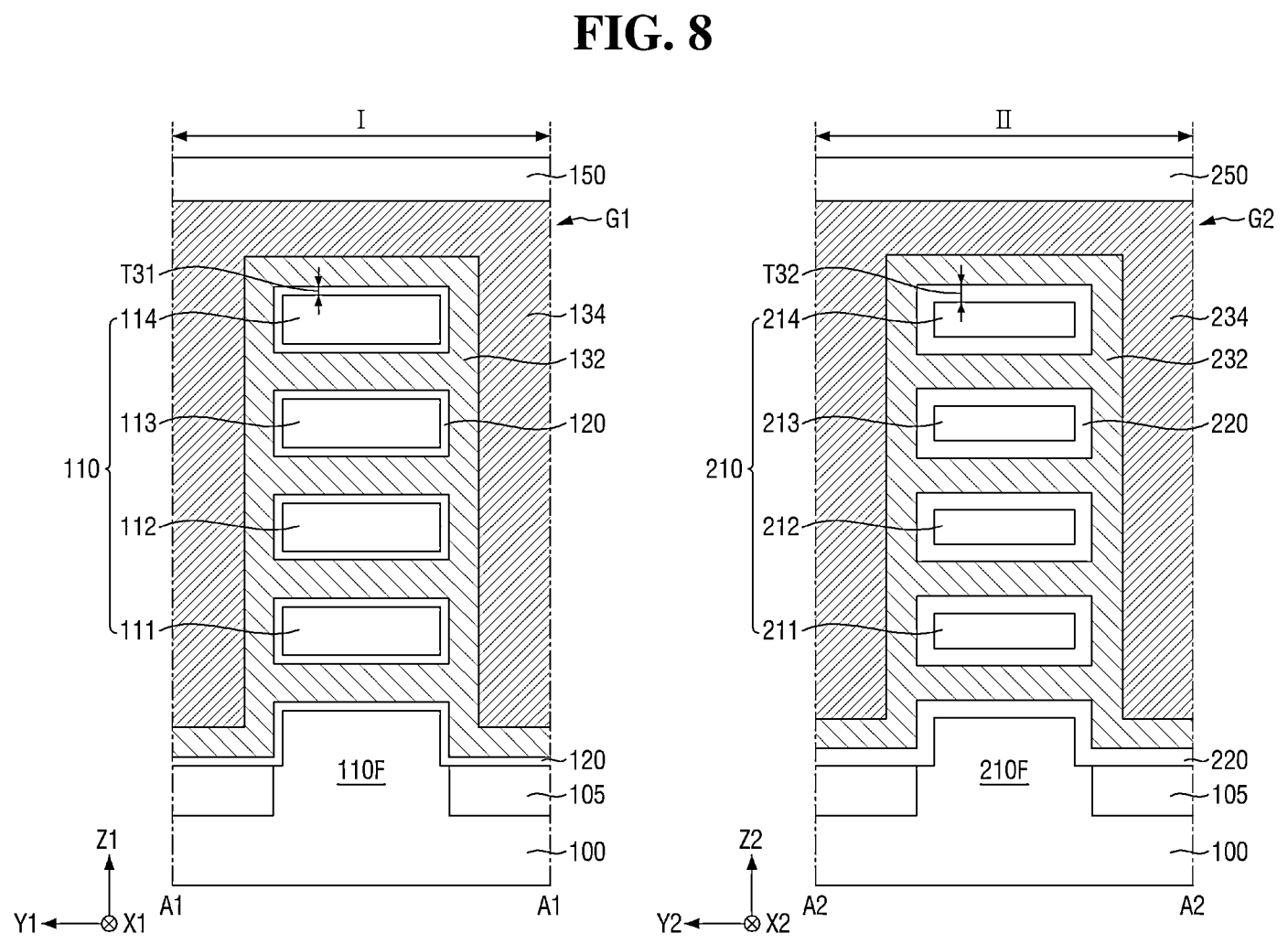
Figure 9:
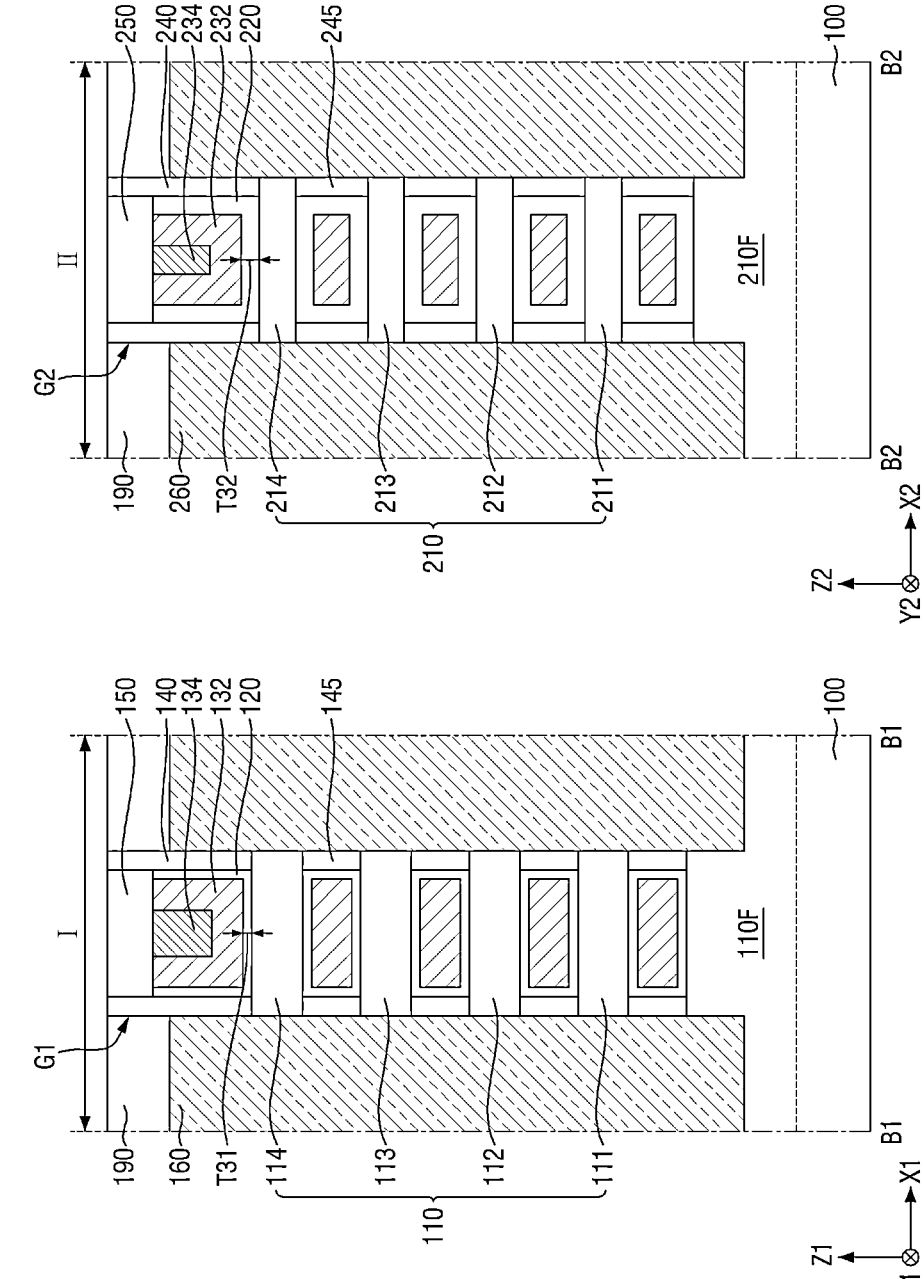

FIGS. 8 and 9 are cross-sectional views of a semiconductor device according to some embodiments of the present disclosure. For convenience, the semiconductor device according to some embodiments of the present disclosure will hereinafter be described, focusing mainly on the differences with the semiconductor device of FIGS. 1 through 3. FIG. 8 illustrates cross-sectional views taken along lines A1-A1 and A2-A2 of FIG. 1, and FIG. 9 illustrates cross-sectional views taken along lines B1-B1 and B2-B2 of FIG. 1.

Referring to FIGS. 8 and 9, a second gate dielectric film 220 may be formed to be thicker than a first gate dielectric film 120.

For example, a thickness T32 of the second gate dielectric film 220, which is stacked on each of second active patterns 210, may be greater than a thickness T31 of the first gate dielectric film 120, which is stacked on each of first active patterns 110. As the second active patterns 210 have a reduced size from that of the first active patterns 110, larger spaces may be provided between the second active patterns 210 than between the first active patterns 110. Accordingly, the second gate dielectric film 220 may be formed to be thicker than the first gate dielectric film 120.

In some embodiments, a second region II may be a region that is driven with a higher voltage than a first region I. For example, the first region I may be a single-gate FET (SGFET) region, and the second region II may be an extra-gate FET (EGFET) region. In another example, the first region I may be a logic region or an SRAM region, and the second region II may be an I/O region.

Figure 10:
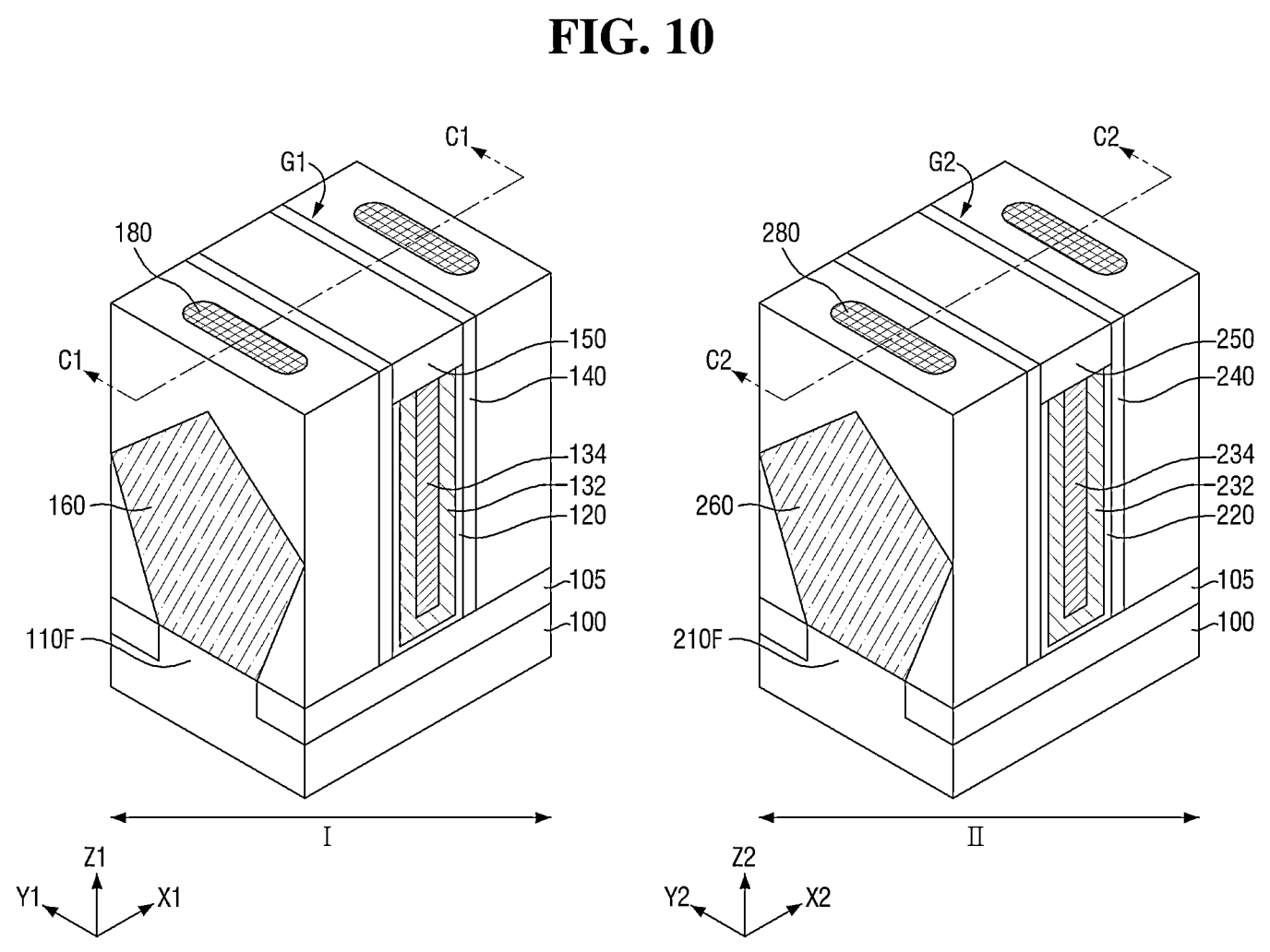
Figure 11:
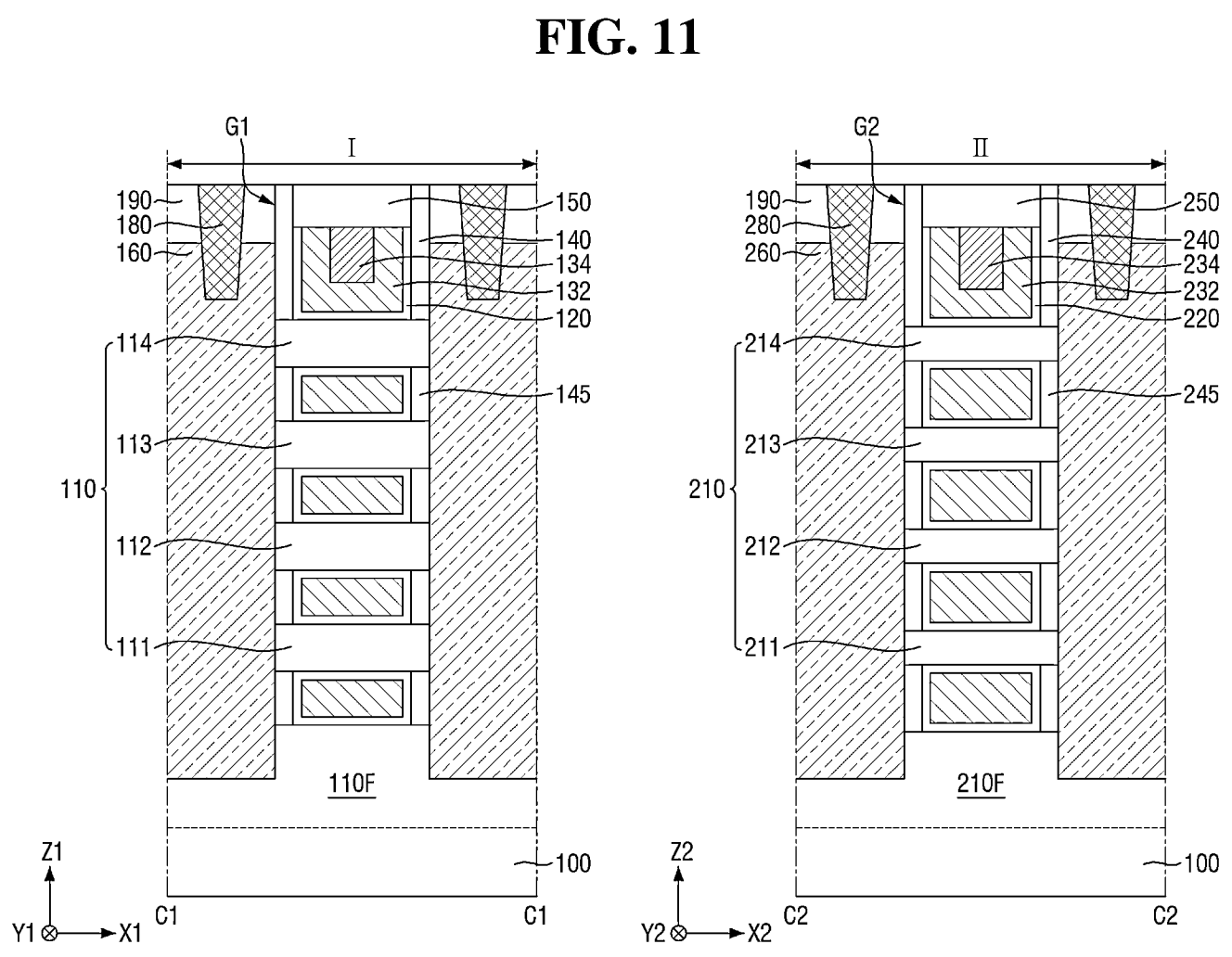

FIG. 10 illustrates perspective views of a semiconductor device according to some embodiments of the present disclosure. FIG. 11 illustrates cross-sectional views taken along lines C1-C1 and C2-C2 of FIG. 10. For convenience, the semiconductor device according to some embodiments of the present disclosure will hereinafter be described, focusing mainly on the differences with the semiconductor device of FIGS. 1 through 3.

Referring to FIGS. 10 and 11, the semiconductor device according to some embodiments of the present disclosure may further include first source/drain contacts 180 and second source/drain contacts 280.

The first source/drain contacts 180 may be connected to first source/drain regions 160. For example, the first source/drain contacts 180 may extend in a first vertical direction Z1, which intersects the top surface of a substrate 100, to penetrate an interlayer insulating film 190 and may be in contact with the first source/drain regions 160.

The second source/drain contacts 280 may be connected to second source/drain regions 260. For example, the second source/drain contacts 280 may extend in a second vertical direction Z2, which intersects the top surface of the substrate 100, to penetrate the interlayer insulating film 190 and may be in contact with the second source/drain regions 260.

The first source/drain contacts 180 and the second source/drain contacts 280 are illustrated as being single layers, but the present disclosure is not limited thereto. Alternatively, each of the first source/drain contacts 180 and/or the second source/drain contacts 280 may include a silicide film, which is in contact with the first source/drain regions 160 and/or the second source/drain regions 260, and a through conductive film, which is formed on the silicide film to penetrate the interlayer insulating film 190. The silicide film may include, for example, platinum (Pt), nickel (Ni), or cobalt (Co), but the present disclosure is not limited thereto. The through conductive film may include, for example, titanium (Ti), titanium nitride (TiN), tungsten (W), Al, or copper (Cu), but the present disclosure is not limited thereto.

A method of fabricating a semiconductor device according to some embodiments of the present disclosure will hereinafter be described with reference to FIGS. 1 through 26.

FIGS. 12 through 26 are perspective views or cross-sectional views illustrating a method of fabricating a semiconductor device according to some embodiments of the present disclosure. For convenience, descriptions of elements or features that have already been described above with reference to FIGS. 1 through 11 will be omitted or simplified.

Figure 12:
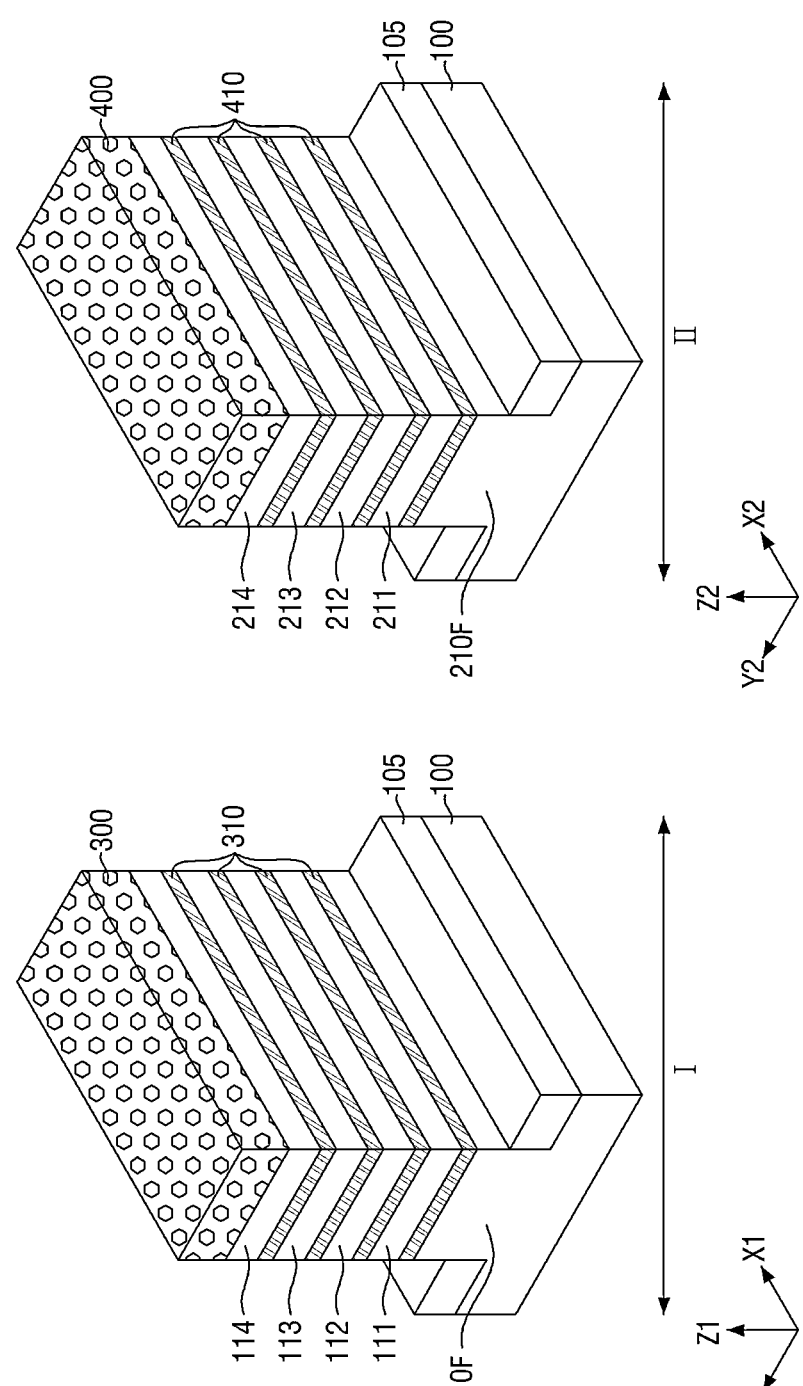

Referring to FIG. 12, a plurality of sheet patterns (e.g., first through fourth sheet patterns 111 through 114) and a plurality of first sacrificial patterns 310 are formed in a first region I of a substrate 100, and a plurality of sheet patterns (e.g., fifth through eighth sheet patterns 211 through 214) and a plurality of second sacrificial patterns 410 are formed in a second region II of the substrate 100.

For example, first and second material films may be formed to be sequentially stacked on the first and second regions I and II of the substrate 100. Thereafter, a first mask pattern 300, which extends in a first direction X1, may be formed on the first and second material films, on the first region I, and a second mask pattern 400, which extends in a third direction X3, may be formed on the first and second material films, on the second region II. Thereafter, the first and second material films may be patterned using the first and second mask patterns 300 and 400 as an etching mask.

The patterned first material film may form the first sacrificial patterns 310 on the first region I, and the patterned second material film may form the first through fourth sheet patterns 111 through 114, which are alternately stacked with the first sacrificial patterns 310, on the first region I. Also, the patterned first material film may form the second sacrificial patterns 410 on the second region II, and the patterned second material film may form the fifth through eighth sheet patterns 211 through 214, which are alternately stacked with the second sacrificial patterns 410, on the second region II.

The first through fourth sheet patterns 111 through 114 and the fifth through eighth sheet patterns 211 through 214 may have different etching selectivities. For example, the first through fourth sheet patterns 111 through 114 and the fifth through eighth sheet patterns 211 through 214 may include Si, and the first sacrificial patterns 310 and the second sacrificial patterns 410 may include SiGe.

In some embodiments, during the patterning of the first and second material films, part of the substrate 100 may be etched so that first and second fin patterns 110F and 210F may be formed. Thereafter, a field insulating film 106 may be formed on the substrate 100. The field insulating film 105 may cover at least parts of the side surfaces of the first fin pattern 110F and at least parts of the side surfaces of the second fin pattern 210F.

Figure 13:
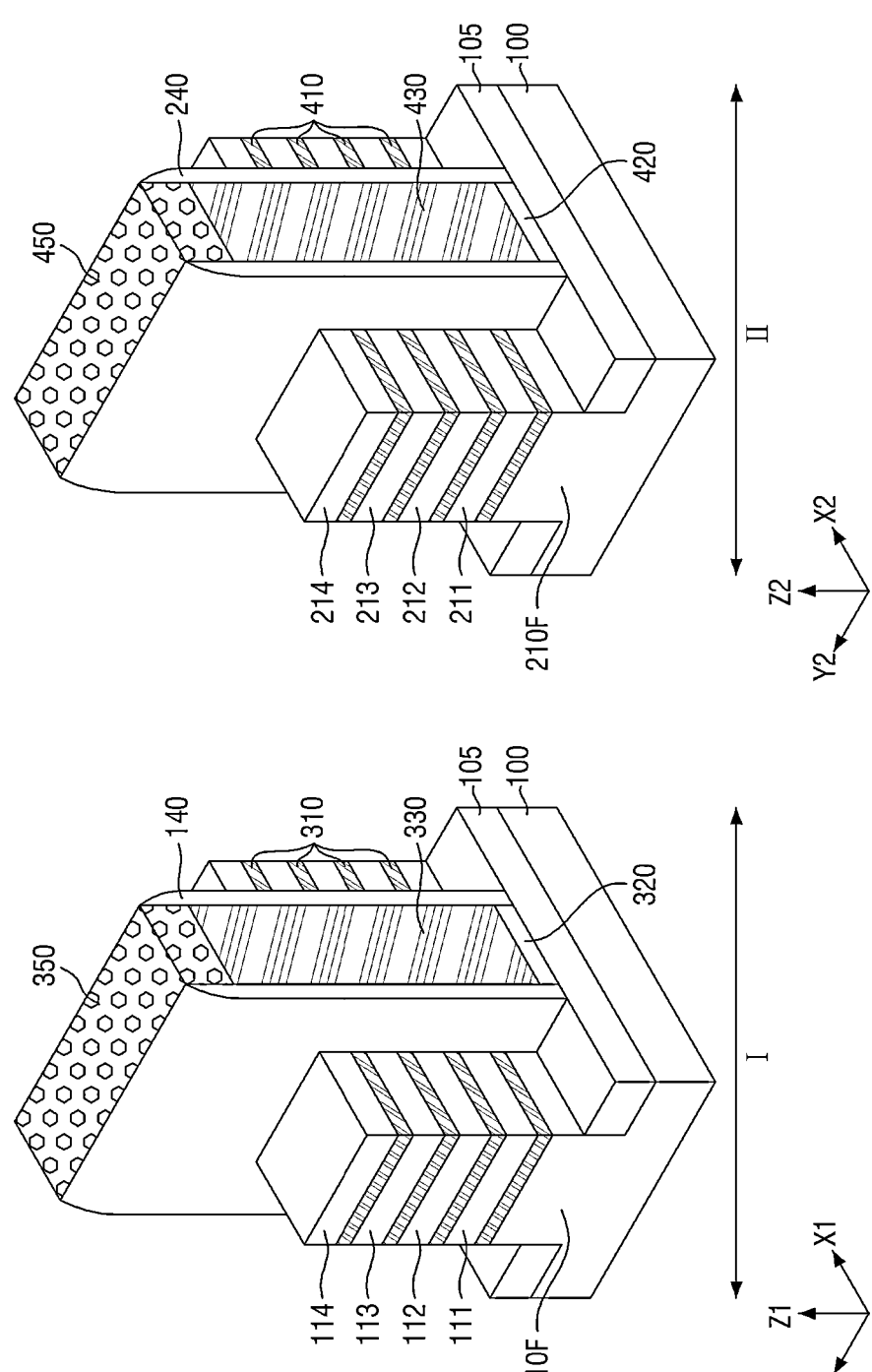

Referring to FIG. 13, a first dummy gate structure (320 and 330) and first gate spacers 140 are formed on the first region I of the substrate 100, and a second dummy gate structure (420 and 430) and second gate spacers 240 are formed on the second region II of the substrate 100.

The first dummy gate structure (320 and 330) may be formed on the first region I of the substrate 100 and on the field insulating film 105. The first dummy gate structure (320 and 330) may intersect the first through fourth sheet patterns 111 through 114 and the first sacrificial patterns 310.

For example, the first dummy gate structure (320 and 330) may extend in a second direction Y1. The first through fourth sheet patterns 111 through 114 and the first sacrificial patterns 310 may extend in the second direction Y1 to penetrate the first dummy gate structure (320 and 330).

The second dummy gate structure (420 and 430) may be formed on the second region II of the substrate 100 and on the field insulating film 105. The second dummy gate structure (420 and 430) may intersect the fifth through eighth sheet patterns 211 through 214 and the second sacrificial patterns 410. For example, the second dummy gate structure (420 and 430) may extend in a fourth direction Y2. The fifth through eighth sheet patterns 211 through 214 and the second sacrificial patterns 410 may extend in the fourth direction Y2 to penetrate the second dummy gate structure (420 and 430).

In some embodiments, the first dummy gate structure (320 and 330) may include a first dummy gate dielectric film 320 and a first dummy gate electrode 330, which are sequentially stacked on the substrate 100 and the field insulating film 105, and the second dummy gate structure (420 and 430) may include a second dummy gate dielectric film 420 and a second dummy gate electrode 430, which are sequentially stacked on the substrate 100 and the field insulating film 105. For example, a dielectric film and an electrode film may be formed to be sequentially stacked on the substrate 100 and the field insulating film 105. Thereafter, a third mask pattern 350, which extends in the second direction Y1, may be formed on the electrode film, on the first region I, and a fourth mask pattern 450, which extends in the fourth direction Y2, may be formed on the electrode film, on the second region II. Thereafter, the dielectric film and the electrode film may be patterned using the third and fourth mask patterns 350 and 450 as an etching mask.

The patterned dielectric film may form the first dummy gate dielectric film 320 on the first region I, and the patterned electrode film may form the first dummy gate electrode 330 on the first region I. Also, the patterned dielectric film may form the second dummy gate dielectric film 420 on the second region II, and the patterned electrode film may form the second dummy gate electrode 430 on the second region II.

The first dummy gate structure (320 and 330) may have a different etching selectivity from the first through fourth sheet patterns 111 through 114 and the first sacrificial patterns 310, and the second dummy gate structure (420 and 430) may have a different etching selectivity from the fifth through eighth sheet patterns 211 through 214 and the second sacrificial patterns 410. For example, the first and second dummy gate electrodes 330 and 430 may include polysilicon.

The first gate spacers 140 may be formed on the substrate 100 and the field insulating film 105. The first gate spacers 140 may extend along the side surfaces of the first dummy gate structure (320 and 330). The second gate spacers 240 may be formed on the substrate 100 and the field insulating film 105. The second gate spacers 240 may extend along the side surfaces of the second dummy gate structure (420 and 430).

Figure 14:
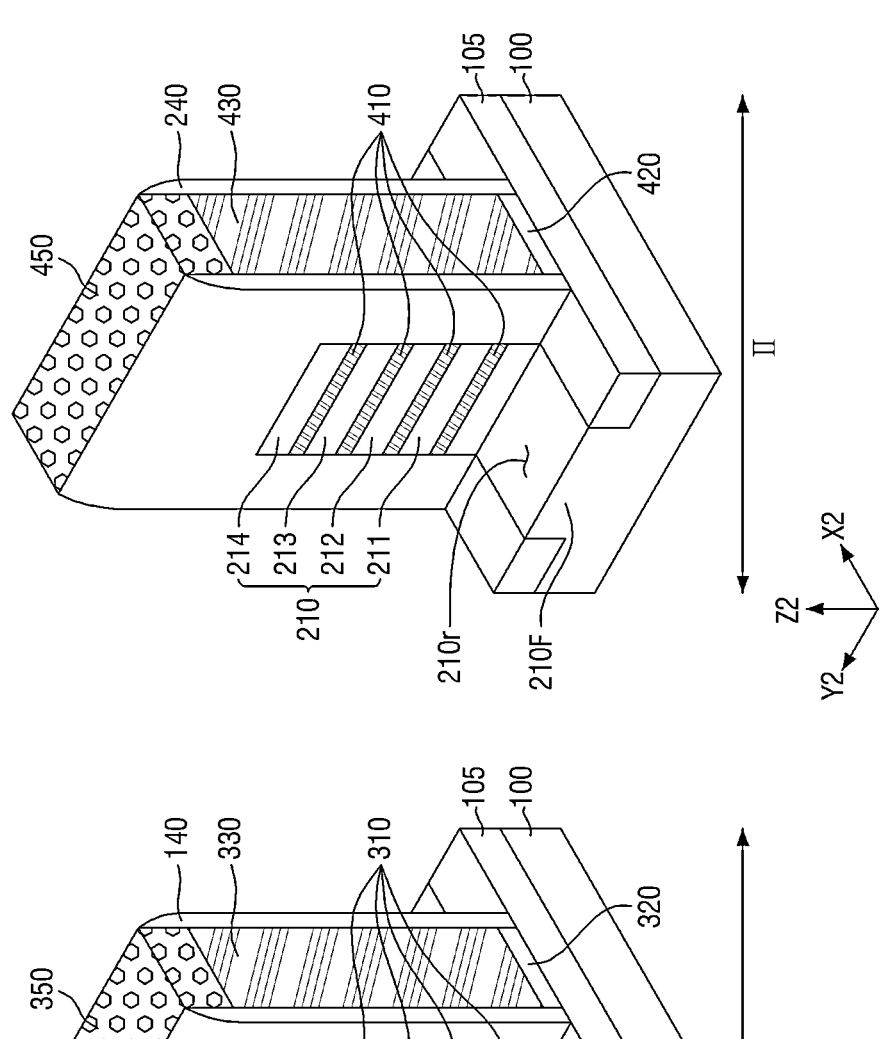

Referring to FIG. 14, a first recess process is performed on the first through fourth sheet patterns 111 through 114, the fifth through eighth sheet patterns 211 through 214, the first sacrificial patterns 310, and the second sacrificial patterns 410.

As a result of the first recess process, parts of the first through fourth sheet patterns 111 through 114 and parts of the first sacrificial patterns 310 on the outside of the first dummy gate structure (320 and 330) may be removed so that first recesses 110r may be formed. Also, first active patterns 110 including the first through fourth sheet patterns 111 through 114 may be formed. During the formation of the first recesses 110r, an upper portion of the first fin pattern 110F may be removed.

Also, as a result of the first recess process, parts of the fifth through eighth sheet patterns 211 through 214 and parts of the second sacrificial patterns 410 on the outside of the second dummy gate structure (420 and 430) may be removed so that second recesses 210r may be formed. Also, second active patterns 210 including the fifth through eighth sheet patterns 211 through 214 may be formed. During the formation of the second recesses 210r, an upper portion of the second fin pattern 210F may be removed.

Figure 15:
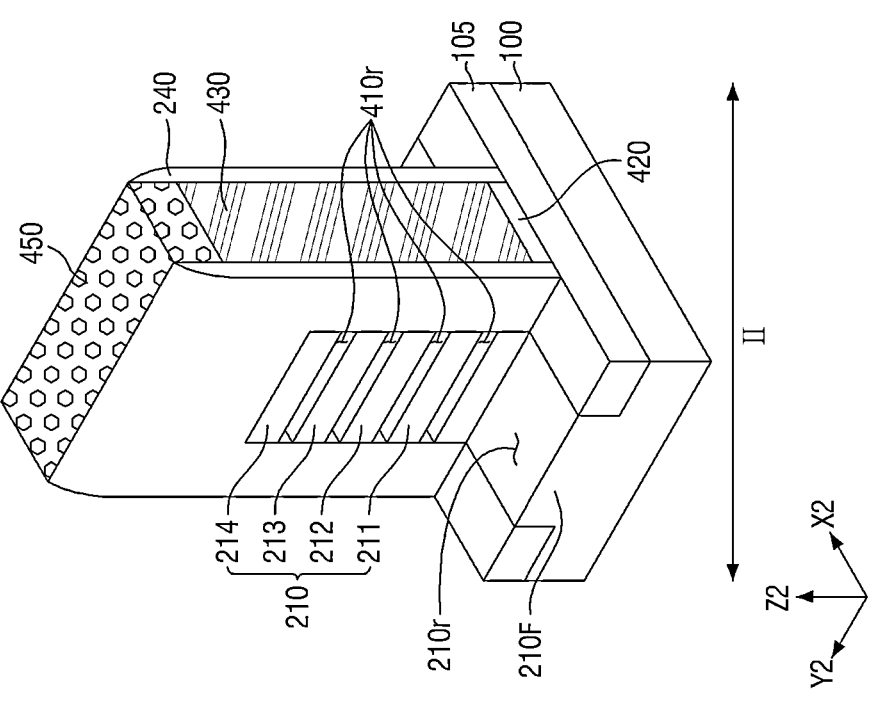
Figure 15:
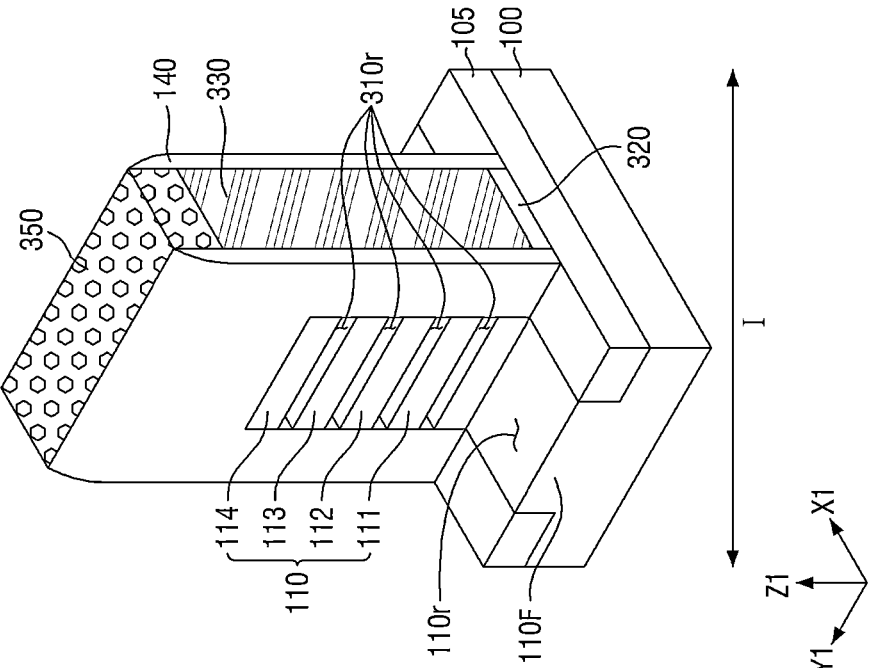

Referring to FIG. 15, a second recess process is performed on the first sacrificial patterns 310 exposed by the first recesses 110r and/or the second sacrificial patterns 410 exposed by the second recesses 210r.

As the second recess process is performed, the side surfaces of each of the first sacrificial patterns 310, exposed by the first recesses 110r, may be recessed so that third recesses 310r may be formed. As the third recesses 310r are formed, the first active patterns 110 may protrude beyond the first sacrificial patterns 310 in the first direction X1.

Also, as the second recess process is performed, the side surfaces of each of the second sacrificial patterns 410, exposed by the second recesses 210r, may be recessed so that fourth recesses 410r may be formed. As the fourth recesses 410r are formed, the second active patterns 210 may protrude beyond the second sacrificial patterns 410 in the third direction X2.

In other embodiments, the third recesses 310r and/or the fourth recesses 410r may not be provided.

Figure 16:
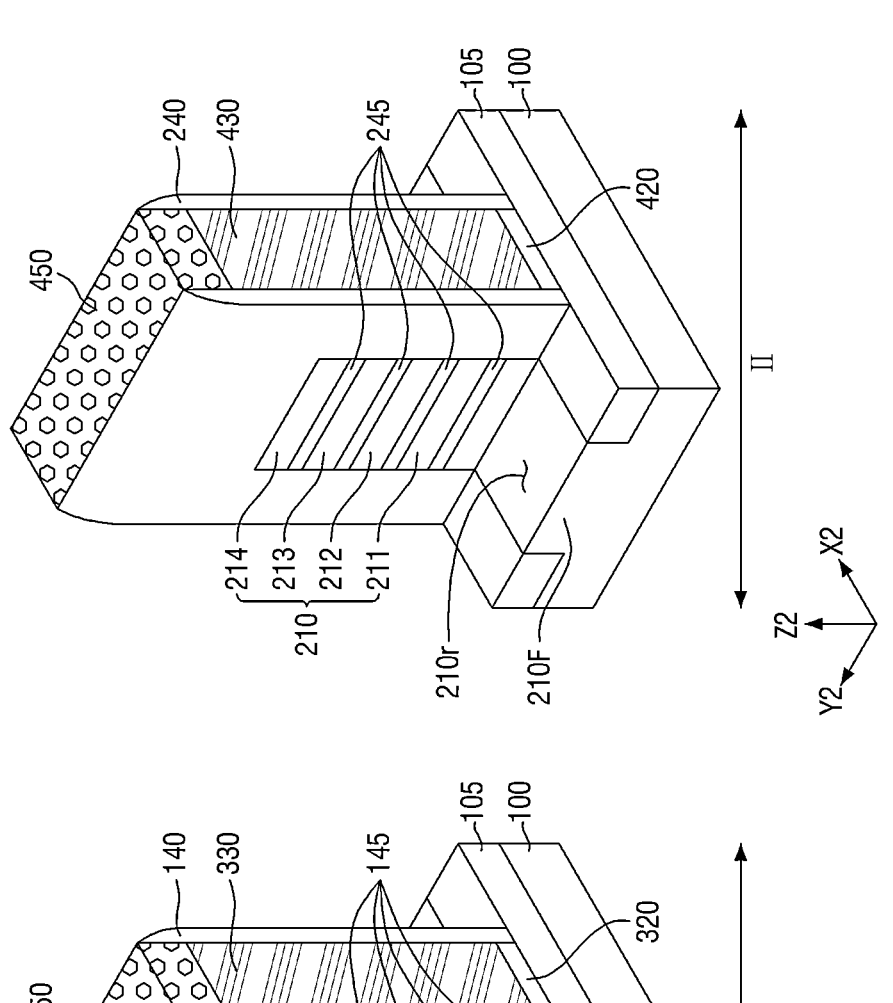

Referring to FIG. 16, first inner spacers 145 and/or second inner spacers 245 are formed.

The first inner spacers 145 may be formed to fill the third recesses 310r. Also, the second inner spacers 245 may be formed to fill the fourth recesses 410r. For example, a spacer film may be formed to extend conformally along the surfaces of the structures illustrated in FIG. 15. Thereafter, a recess process may be performed on the spacer film. As a result, the first inner spacers 145 may be formed between the first active patterns 110, and the second inner spacers 245 may be formed between the second active patterns 210.

Figure 17:
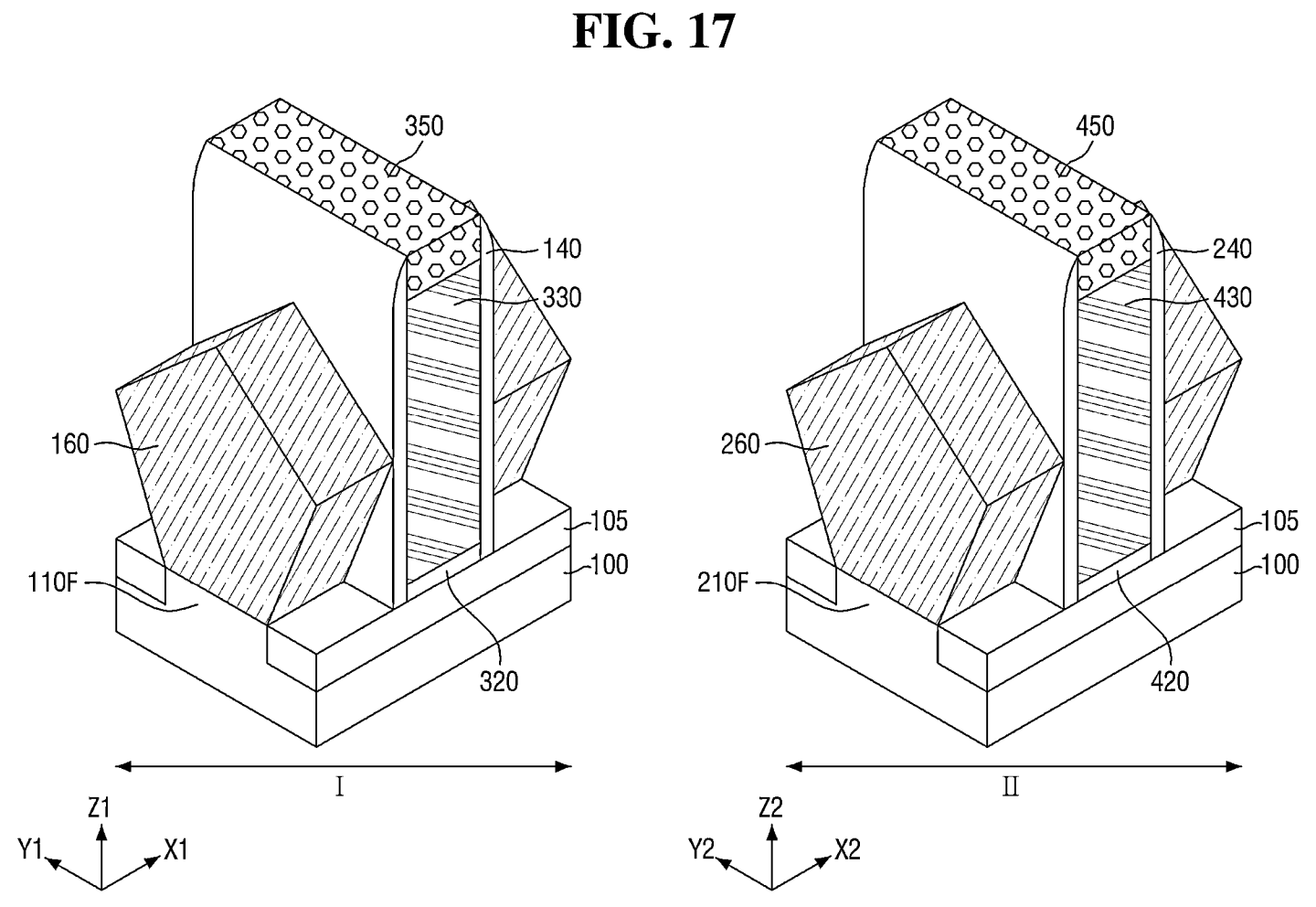

Referring to FIG. 17, first source/drain regions 160 are formed on the side surfaces of the first dummy gate structure (320 and 330), and second source/drain regions 260 are formed on the side surfaces of the second dummy gate structure (420 and 430).

The first source/drain regions 160 may fill the first recesses 110r. For example, the first source/drain regions 160 may be formed by an epitaxial growth method using the first fin pattern 110F and the first active patterns 110 as a seed layer. As a result, the first source/drain regions 160 may be formed to be connected to the first active patterns 110.

The second source/drain regions 260 may fill the second recesses 210r. For example, the second source/drain regions 260 may be formed by an epitaxial growth method using the second fin pattern 210F and the second active patterns 210 as a seed layer. As a result, the second source/drain regions 260 may be formed to be connected to the second active patterns 210.

The first source/drain regions 160 and the second source/drain regions 260 may be formed on the same level (at the same time) or on different levels.

Figure 18:
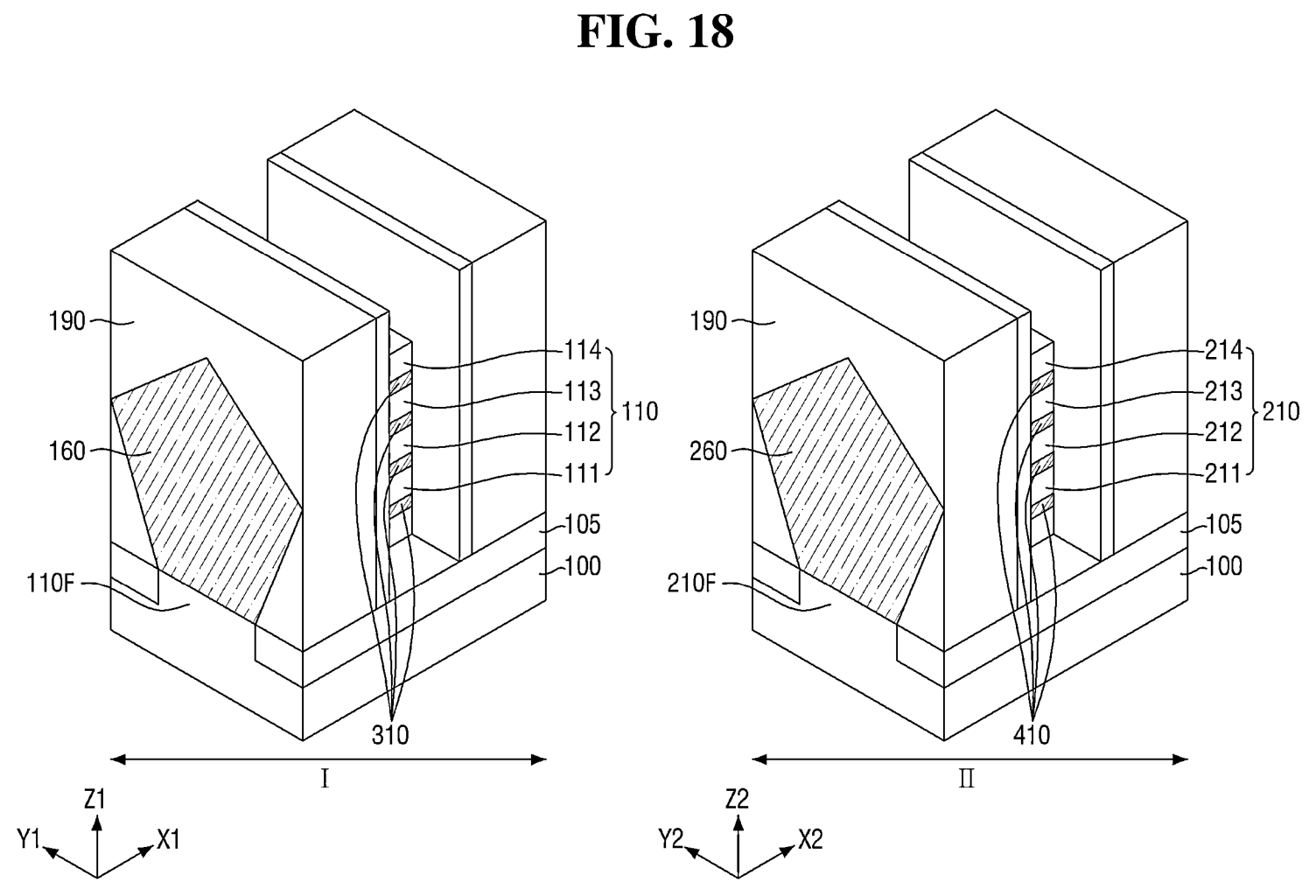

Referring to FIG. 18, the first dummy gate structure (320 and 330) and the second dummy gate structure (420 and 430) are removed.

For example, an interlayer insulating film 190 may be formed on the substrate 100 and the field insulating film 105. The interlayer insulating film 190 may be formed to fill the spaces on the outside of the first gate spacers 140 and on the outside of the second gate spacers 240. Thereafter, a planarization process may be performed to expose the first dummy gate structure (320 and 330) and the second dummy gate structure (420 and 430). The planarization process may include, for example, a chemical mechanical polishing (CMP) process, but the present disclosure is not limited thereto. Thereafter, the first dummy gate structure (320 and 330) and the second dummy gate structure (420 and 430), exposed by the interlayer insulating film 190, the first gate spacers 140, and the second gate spacers 240, may be removed.

As already mentioned above, as the first dummy gate structure (320 and 330) have a different etching selectivity from the first through fourth sheet patterns 111 through 114 and the first sacrificial patterns 310 and the second dummy gate structure (420 and 430) have a different etching selectivity from the fifth through eighth sheet patterns 211 through 214 and the second sacrificial patterns 410, the first dummy gate structure (320 and 330) and the second dummy gate structure (420 and 430) may be selectively removed. As the first dummy gate structure (320 and 330) is removed, the first active patterns 110 and the first active patterns 110, on the inside of the first gate spacers 140, may be exposed. Also, as the second dummy gate structure (420 and 430) is removed, the second active patterns 210 and the second active patterns 210, on the inside of the second gate spacers 240, may be exposed.

Figure 19:
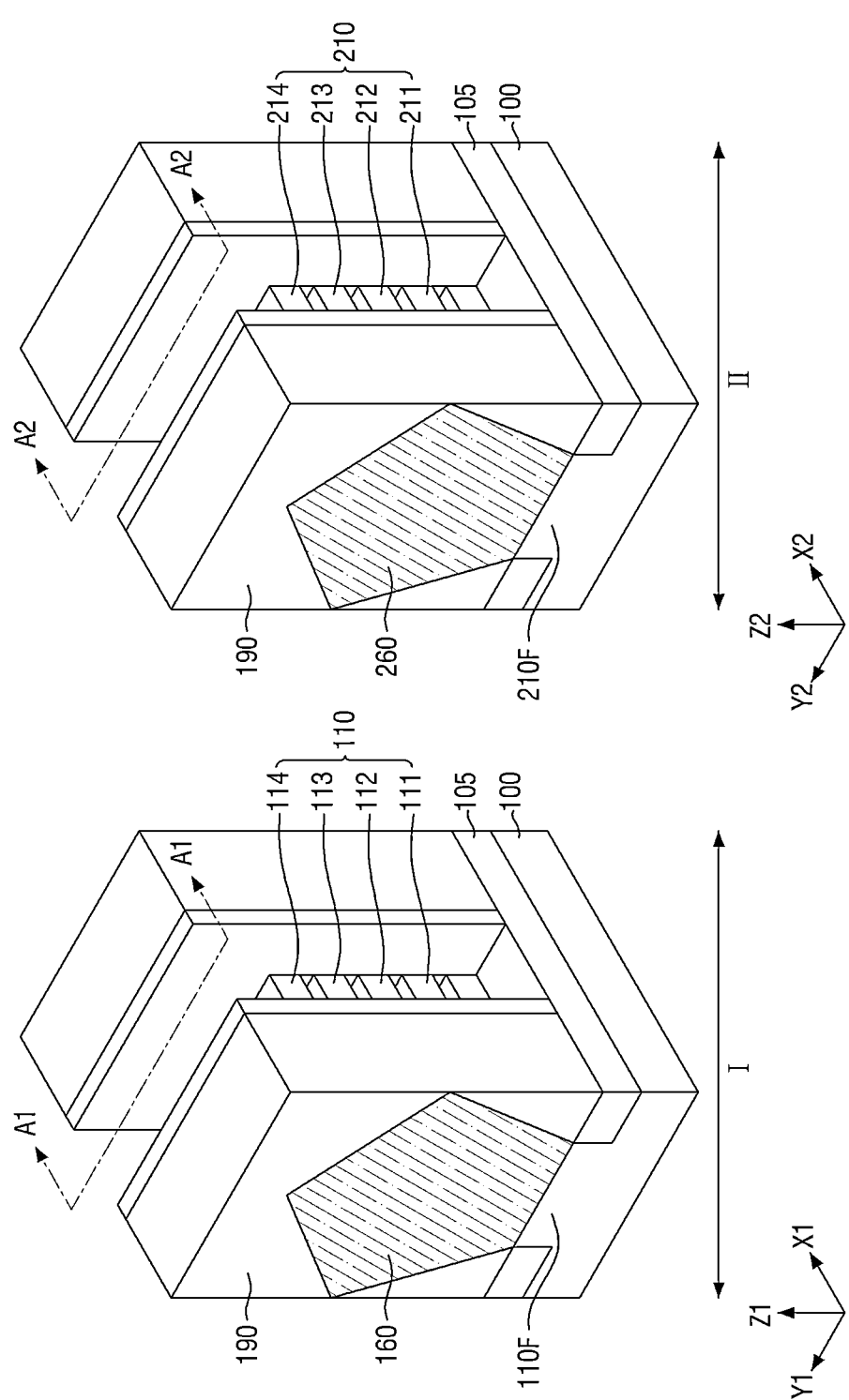
Figure 20:
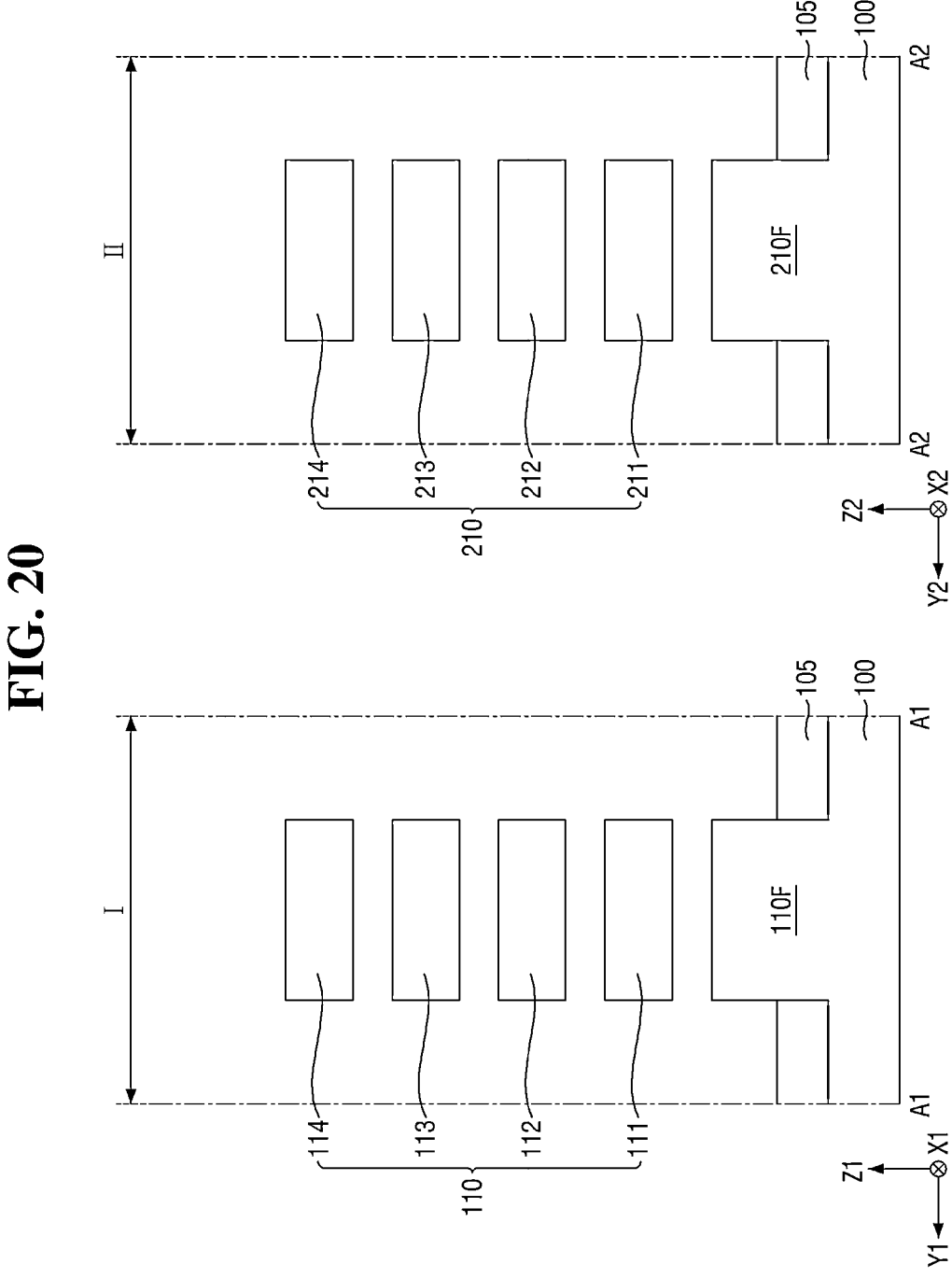

Referring to FIGS. 19 and 20, the first sacrificial patterns 310 and the second sacrificial patterns 410 are removed. FIG. 20 illustrates cross-sectional views taken along lines A1-A1 and A2-A2 of FIG. 19.

As already mentioned above, as the first through fourth sheet patterns 111 through 114 and the fifth through eighth sheet patterns 211 through 214 have a different etching selectivity from the first sacrificial patterns 310 and the second sacrificial patterns 410, the first sacrificial patterns 310 and the second sacrificial patterns 410 may be selectively removed. As the first sacrificial patterns 310 and the second sacrificial patterns 410 are removed, the first active patterns 110 may be formed to be spaced apart from one another on the first region I of the substrate 100, and the second active patterns 210 may be formed to be spaced apart from one another on the second region II of the substrate 100.

Figure 21:
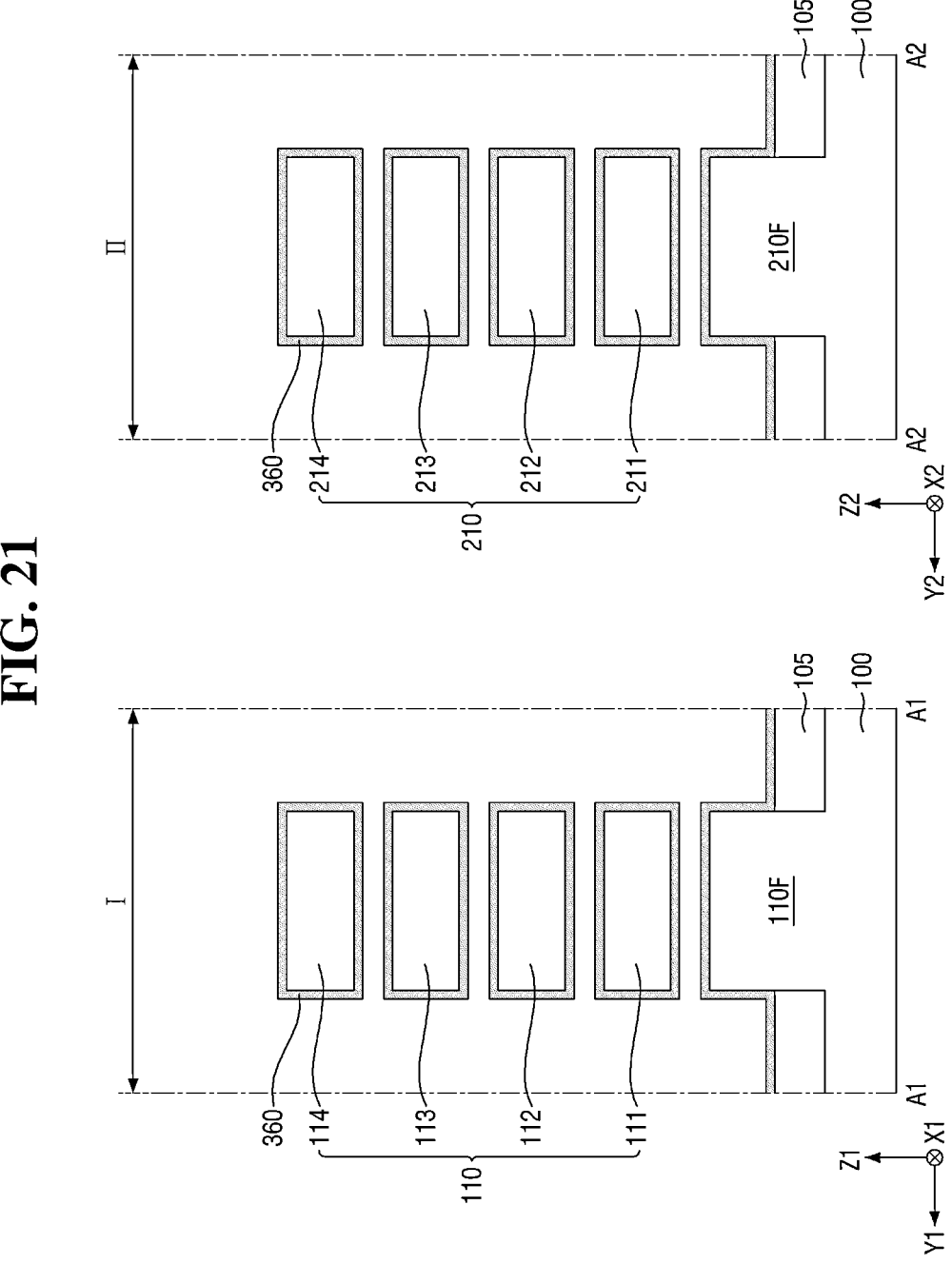

Referring to FIG. 21, a preliminary oxide film 360 is formed on each of the first active patterns 110 and each of the second active patterns 210.

The preliminary oxide film 360 may surround each of the first active patterns 110, on the first region I and each of the second active patterns 210, on the second region II. The preliminary oxide film 360 may include, for example, a silicon oxide film, but the present disclosure is not limited thereto.

In some embodiments, the preliminary oxide film 360 may be formed by a deposition process. In this case, the preliminary oxide film 360 may extend conformally along the surfaces of the structures illustrated in FIG. 20. For example, the preliminary oxide film 360 may extend further along the top surface of the field insulating film 105, the surfaces of part of the first fin pattern 110F that protrudes beyond the field insulating film 105, and the surfaces of part of the second fin pattern 210F that protrudes beyond the field insulating film 105.

In other embodiments, the preliminary oxide film 360 may be formed by the oxidation of the first active patterns 110 and the second active patterns 210. For example, the preliminary oxide film 360 may extend further along the surfaces of the part of the first fin pattern 110F that protrudes beyond the field insulating film 105 and the surfaces of the part of the second fin pattern 210F that protrudes beyond the field insulating film 105.

Figure 22:
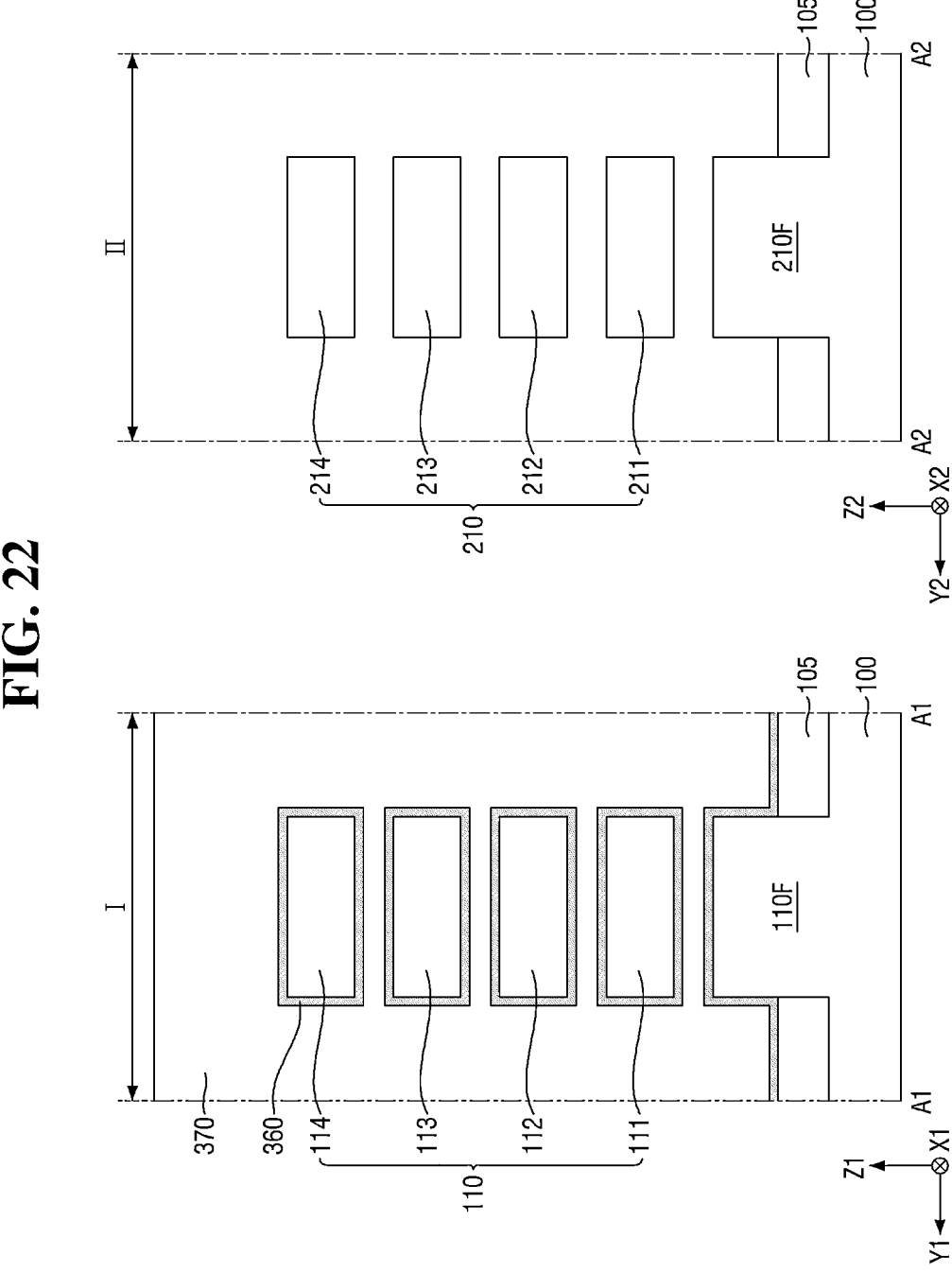

Referring to FIG. 22, the preliminary oxide film 360 is removed from the second region II.

For example, a protective mask pattern 370, which covers the first region I, may be formed. Thereafter, an etching process may be performed using the protective mask pattern 370 as an etching mask to remove the preliminary oxide film 360 from the second region II. The etching process may include a wet etching process, but the present disclosure is not limited thereto. After the removal of the preliminary oxide film 360 from the second region II, the protective mask pattern 370 may be removed.

Figure 23:
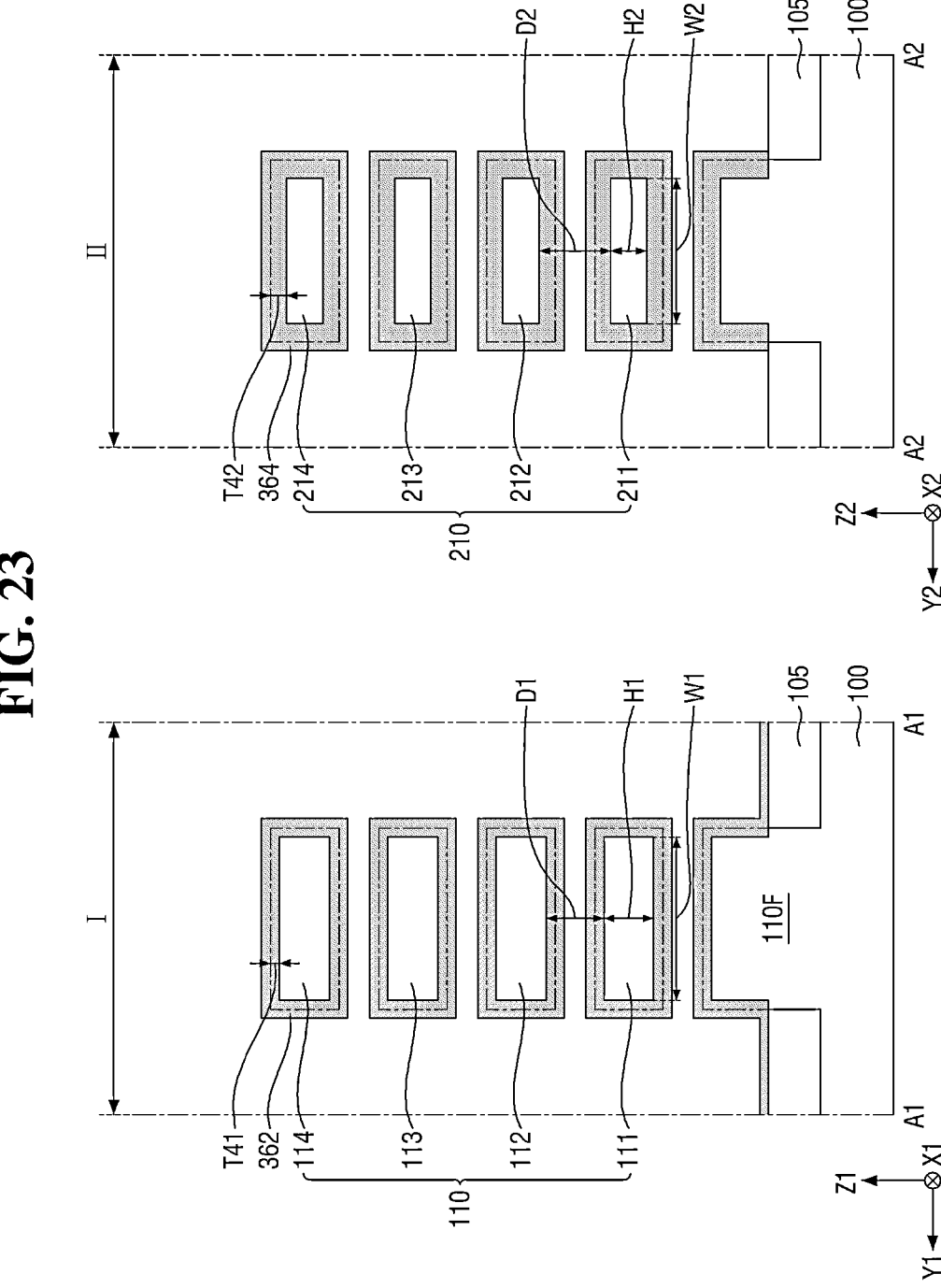

Referring to FIG. 23, an oxidation process is performed on the first active patterns 110 and the second active patterns 210.

As the oxidation process is performed, a first oxide film 362, which surrounds each of the first active patterns 110, may be formed, and a second oxide film 364, which surrounds each of the second active patterns 210, may be formed. The first oxide film 362 may be formed on the surfaces of part of the first fin pattern 110 that is exposed from the field insulating film 105, and the second oxide film 364 may be formed on the surfaces of part of the second fin pattern 210 that is exposed from the field insulating film 105.

As the oxidation process is performed, the first oxide film 362 may include an oxide of the material of the first active patterns 110, and the second oxide film 364 may include an oxide of the material of the second active patterns 210. For example, in a case where the first active patterns 210 and the second active patterns 210 include Si, the first oxide film 362 and the second oxide film 364 may include silicon oxide films.

As already mentioned above with reference to FIG. 22, before the oxidation process, the first active patterns 110 may be protected by the preliminary oxide film 360, and the second active patterns 210 may be exposed. Thus, during the oxidation process, the surfaces of each of the second active patterns 210, which are exposed, may be oxidated faster than the surfaces of each of the first active patterns 110, which are protected by the preliminary oxide film 360. For example, a thickness T42 by which each of the second active patterns 210 is consumed by the oxidation process may be greater than a thickness T41 by which each of the first active patterns 110 is consumed by the oxidation process.

In this manner, second active patterns 210 having a reduced size from that of the first active patterns 110 may be formed. For example, a thickness H2 of the fifth sheet pattern 211 may be less than a thickness H1 of the first sheet pattern 111, and a width W2 of the fifth sheet pattern 211 may be less than a width W1 of the first sheet pattern 111.

Also, as the second active patterns 210 have a reduced size from that of the first active patterns 110, the distance between the second active patterns 210 may be greater than the distance between the first active patterns 110. For example, a distance D2 between the fifth and sixth sheet patterns 211 and 212 may be greater than a distance D1 between the first and second sheet patterns 111 and 112.

Figure 24:
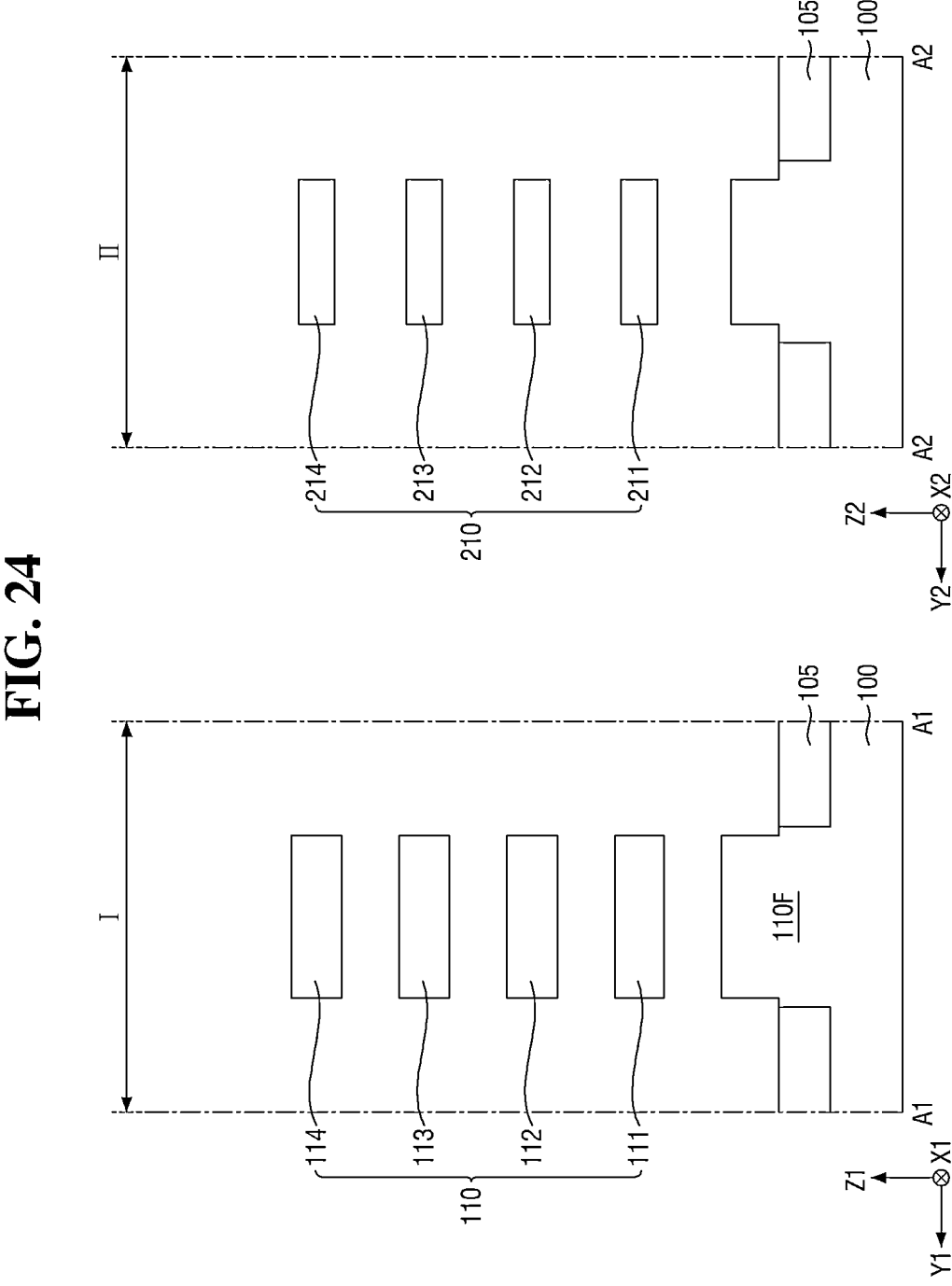

Referring to FIG. 24, the first and second oxide films 362 and 364 are removed.

For example, an etching process for removing the first and second oxide films 362 and 364 may be performed. The etching process may include a wet etching process, but the present disclosure is not limited thereto. As the first and second oxide films 362 and 364 are removed, the first active patterns 110 and the second active patterns 210 may be exposed again.

Figure 25:
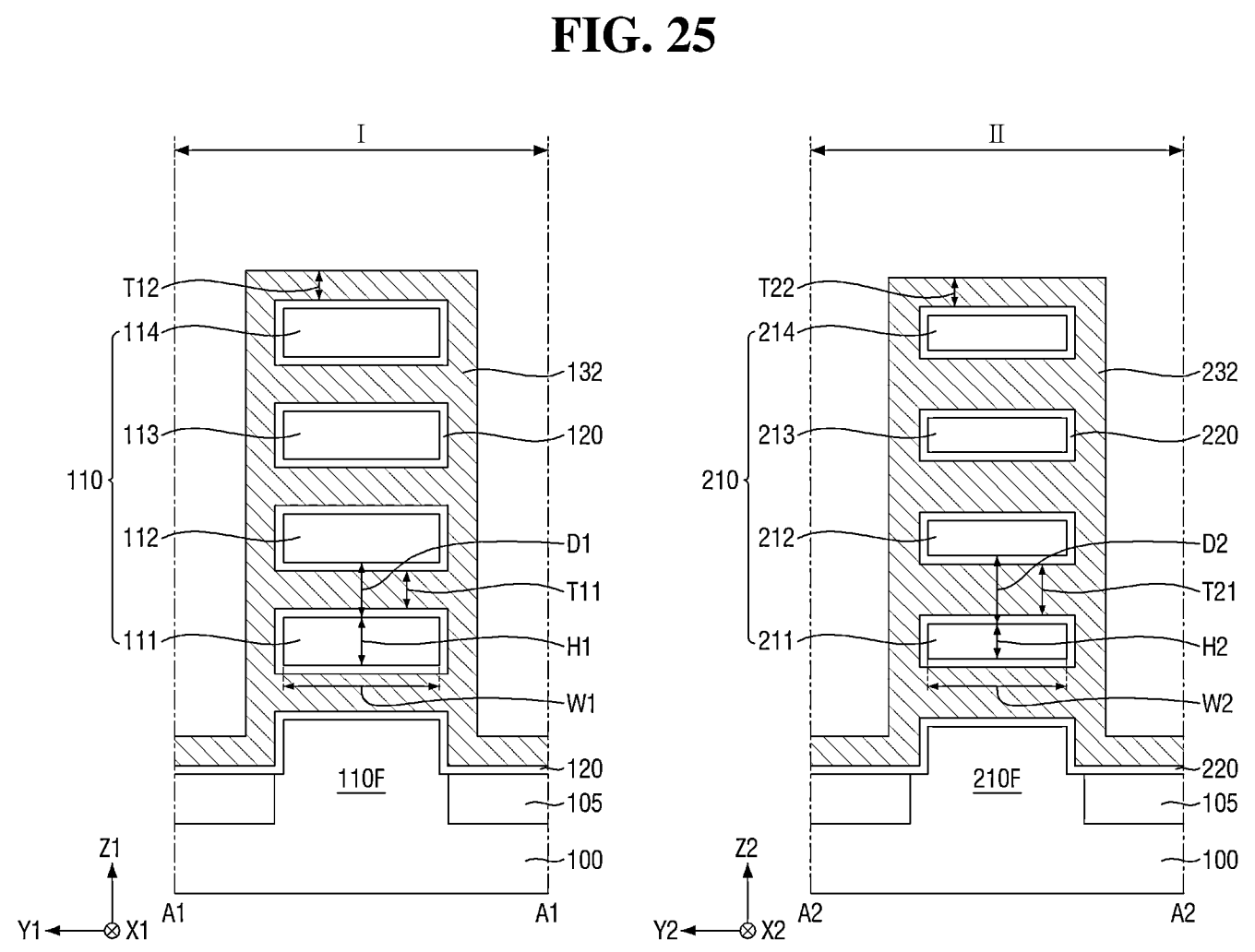

Referring to FIG. 25, a first gate dielectric film 120, a second gate dielectric film 220, a first work function controlling film 132, and a second work function controlling film 232 are formed.

The first gate dielectric film 120 and the first work function controlling film 132 may be sequentially stacked on each of the first active patterns 110. The second gate dielectric film 220 and the second work function controlling film 232 may be sequentially stacked on each of the second active patterns 210.

The first work function controlling film 132 may fill the gaps between the first active patterns 110, and the second work function controlling film 232 may fill the gaps between the second active patterns 210. As the second active patterns 210 have a reduced size from that of the first active patterns 110, the thickness of the second work function controlling film 232 between the second active patterns 210 may be greater than the thickness of the first work function controlling film 132 between the first active patterns 110. For example, a thickness T21 of the second work function controlling film 232 between the fifth and sixth sheet patterns 211 and 212 may be greater than a thickness T11 of the first work function controlling film 132 between the first and second sheet patterns 111 and 112.

Figure 26:
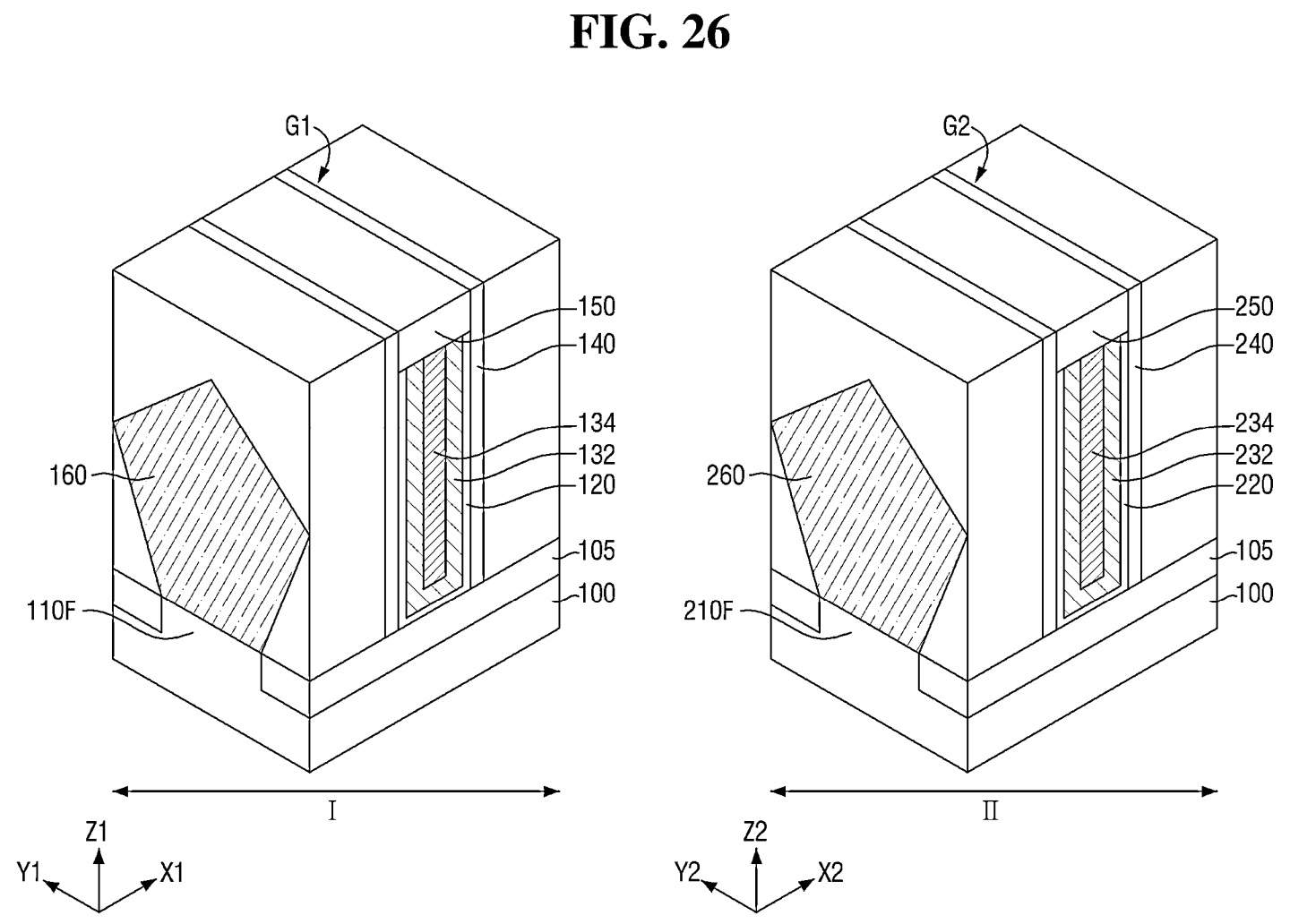

Referring to FIG. 26, first and second filling conductive films 134 and 234 are formed.

The first filling conductive film 134 may be stacked on the first work function controlling film 132, and the second filling conductive film 234 may be stacked on the second work function controlling film 232. In this manner, the semiconductor device of FIGS. 1 through 3 may be obtained.

As the method of fabricating a semiconductor device according to some embodiments of the present disclosure uses full-scale oxide film forming processes to form active patterns having a reduced size (e.g., the second active patterns 210), the method of fabricating a semiconductor device according to some embodiments of the present disclosure has few limitations and low process difficulty. For example, as already mentioned above, oxide film forming processes for forming the preliminary oxide film 360, the first oxide film 362, and the second oxide film 364 may all be performed on both the first and second regions I and II. Accordingly, the method of fabricating a semiconductor device according to some embodiments of the present disclosure has fewer limitations (e.g., thermal limitations) and lower process difficulty than a method of selectively forming an oxide film in only some area (e.g., either the first region I or the second region II).

While some embodiments have been described, those skilled in the art will appreciate that many variations and modifications may be made to the presented embodiments without substantially departing from the from the spirit and scope of inventive concepts as defined by the following claims. It is therefore desired that the presented embodiments be considered in all respects as illustrative and not restrictive, reference being made to the appended claims rather than the foregoing description to indicate the scope of inventive concepts.

What is claimed is:

1. A semiconductor device comprising:
a substrate including a first region and a second region;
a first sheet pattern and a second sheet pattern on the first region of the substrate and extending in a first direction while being spaced apart from, and adjacent to, each other;
a first gate electrode extending in a second direction that intersects the first direction, the first gate electrode extending between the first sheet pattern and the second sheet pattern;
a third sheet pattern and a fourth sheet pattern on the second region of the substrate and extending in a third direction while being spaced apart from, and adjacent to, each other; and
a second gate electrode extending in a fourth direction that intersects the third direction, the second gate electrode extending between the third sheet pattern and the fourth sheet pattern,
wherein
the first gate electrode includes a first work function controlling film and a first filling conductive film on the first work function controlling film,
the first work function controlling film fills a gap between the first sheet pattern and the second sheet pattern,
the second gate electrode includes a second work function controlling film and a second filling conductive film,
the second work function controlling film fills a gap between the third sheet pattern and the fourth sheet pattern,
the second filling conductive film is on the second work function controlling film, and
a distance between the third sheet pattern and the fourth sheet pattern is greater than a distance between the first sheet pattern and the second sheet pattern.

2. The semiconductor device of claim 1, wherein a thickness of the second work function controlling film between the third sheet pattern and the fourth sheet pattern is greater than a thickness of the first work function controlling film between the first sheet pattern and the second sheet pattern.

3. The semiconductor device of claim 1, wherein
in a vertical direction intersecting a top surface of the substrate, a thickness of the third sheet pattern and a thickness of the fourth sheet pattern is less than a thickness of the first sheet pattern and a thickness of the second sheet pattern.

4. The semiconductor device of claim 3, wherein
a width in the second direction of the third sheet pattern and a width in the second direction of the fourth sheet pattern are less than a width in the fourth direction of the first sheet pattern and a width in the fourth direction of the second sheet pattern.

5. The semiconductor device of claim 1, wherein
the first sheet pattern and third sheet pattern are level with each other, and
the second sheet pattern and the fourth sheet pattern are level with each other.

6. The semiconductor device of claim 1, wherein a material in the first work function controlling film is the same as a material in the second work function controlling film.

7. The semiconductor device of claim 6, wherein a material in the first filling conductive film is the same as a material in the second filling conductive film.

8. The semiconductor device of claim 1, further comprising:

a first gate dielectric film between the first sheet pattern and the first gate electrode and between the second sheet pattern and the first gate electrode; and a second gate dielectric film between the third sheet pattern and the second gate electrode and between the fourth sheet pattern and the second gate electrode, wherein a thickness of the second gate dielectric film is greater than a thickness of the first gate dielectric film.

9. A semiconductor device comprising:

a substrate including a first region and a second region;

a first sheet pattern and a second sheet pattern on the first region of the substrate and extending in a first direction while being spaced apart from, and adjacent to, each other;

a first gate electrode extending in a second direction that intersects the first direction, the first gate electrode extending between the first sheet pattern and the second sheet pattern;

a third sheet pattern and a fourth sheet pattern on the second region of the substrate and extending in a third direction while being spaced apart from, and adjacent to, each other; and a second gate electrode extending in a fourth direction that intersects the third direction, the second gate electrode extending between the third sheet pattern and the fourth sheet pattern, wherein the first gate electrode includes a first work function controlling film and a first filling conductive film on the first work function controlling film, the first work function controlling film (i) surrounds the first sheet pattern and the second sheet pattern and (ii) fills a gap between the first sheet pattern and the second sheet pattern, the second gate electrode includes a second work function controlling film and a second filling conductive film on the second work function controlling film, the second work function controlling film (i) surrounds the third sheet pattern and the fourth sheet pattern and (ii) fills a gap between the third sheet pattern and the fourth sheet pattern, and a thickness of the second work function controlling film between the third sheet pattern and the fourth sheet patterns is greater than a thickness of the first work function controlling film between the first sheet pattern and the second sheet pattern.

10. The semiconductor device of claim 9, wherein a distance between the third sheet pattern and the fourth sheet pattern is greater than a distance between the first sheet pattern and the second sheet pattern.

11. The semiconductor device of claim 9, wherein in a vertical direction intersecting a top surface of the substrate, a thickness of the third sheet pattern and a thickness of the fourth sheet pattern is less than a thickness of the first sheet pattern and a thickness of the second sheet pattern.

12. The semiconductor device of claim 9, wherein a thickness of the first work function controlling film on each of the first sheet pattern and the second sheet pattern is the same as a thickness of the second work function controlling film on each of the third sheet pattern and the fourth sheet pattern.

13. The semiconductor device of claim 9, wherein the first work function controlling film includes a first sub-work function controlling film and a second sub-work function controlling film, which are sequentially formed on each of the first sheet pattern and the second sheet pattern, and the second work function controlling film includes a third sub-work function controlling film and a fourth sub-work function controlling film, which are sequentially formed on each of the third sheet pattern and the fourth sheet pattern.

14. The semiconductor device of claim 13, wherein the first sub-work function controlling film and the third sub-work function controlling film include TiN, and the second sub-work function controlling film and fourth sub-work function controlling film include TiAlC.

15. A semiconductor device comprising:

a substrate including a first region and a second region;

a plurality of first active patterns on the first region of the substrate and extending in a first direction while being spaced apart from each other;

a first gate electrode extending in a second direction that intersects the first direction, the first gate electrode extending between the plurality of first active patterns;

first source/drain regions connected to the plurality of first active patterns and on side surfaces of the first gate electrode;

a plurality of second active patterns on the second region of the substrate and extending in a third direction while being spaced apart from each other; and a second gate electrode extending in a fourth direction that intersects the third direction, the second gate electrode extending between the plurality of second active patterns, wherein the first gate electrode includes a first work function controlling film and a first filling conductive film on the first work function controlling film, the first work function controlling film surrounds each of the plurality of first active patterns and fills gaps between the plurality of first active patterns, the second gate electrode includes a second work function controlling film and a second filling conductive film on the second work function controlling film, the second work function controlling film surrounds each of the plurality of second active patterns and fills gaps between the plurality of second active patterns, and a distance between the plurality of second active patterns is greater than a distance between the plurality of first active patterns.

16. The semiconductor device of claim 15, wherein in a vertical direction intersecting a top surface of the substrate, a thickness of the second active patterns is less than a thickness of the first active patterns.

17. The semiconductor device of claim 15, wherein a material in the first work function controlling film is the same as a material in the second work function controlling film, and a material in the first filling conductive film and is the same as a material in the second filling conductive film.

18. The semiconductor device of claim 15, wherein the second active patterns are on a same level as the first active patterns.

19. The semiconductor device of claim 15, further comprising:

second source/drain regions connected to the plurality of second active patterns and on side surfaces of the second gate electrode;

an interlayer insulating film covering the first source/drain regions and the second source/drain regions on the substrate;

first source/drain contacts connected to the first source/drain regions through the interlayer insulating film; and second source/drain contacts connected to the second source/drain regions through the interlayer insulating film.

20. The semiconductor device of claim 15, wherein the first region and the second region are n-type field-effect transistor (NFET) regions.

* * * * *